(12) United States Patent
Nagai et al.

(10) Patent No.: US 8,629,417 B2
(45) Date of Patent: Jan. 14, 2014

(54) EXTREME ULTRAVIOLET LIGHT GENERATION APPARATUS

(75) Inventors: Shinji Nagai, Kanagawa (JP); Tamotsu Abe, Kanagawa (JP); Takanobu Ishihara, Kanagawa (JP); Osamu Wakabayashi, Kanagawa (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/540,314

(22) Filed: Jul. 2, 2012

(65) Prior Publication Data

US 2012/0267553 A1 Oct. 25, 2012

Related U.S. Application Data

(62) Division of application No. 13/032,172, filed on Feb. 22, 2011, now Pat. No. 8,242,474.

(30) Foreign Application Priority Data

Feb. 22, 2010 (JP) .................... 2010-036046
Dec. 28, 2010 (JP) .................... 2010-294239

(51) Int. Cl.
*G01N 21/33* (2006.01)
*H01J 1/50* (2006.01)
*G21K 5/08* (2006.01)

(52) U.S. Cl.
USPC .... 250/504 R; 250/365; 250/372; 250/423 R; 250/396 R; 250/396 ML

(58) Field of Classification Search
USPC .............. 250/504 R, 365, 372, 423 R, 396 R, 250/396 ML
See application file for complete search history.

(56) References Cited

U.S. PATENT DOCUMENTS

| 4,223,279 A | 9/1980 | Bradford, Jr. et al. |
| 4,247,829 A | 1/1981 | Yagi et al. |

(Continued)

FOREIGN PATENT DOCUMENTS

| EP | 1422570 A2 | 5/2004 |
| EP | 1434095 A1 | 6/2004 |

(Continued)

OTHER PUBLICATIONS

Tao et al., "Mitigation of fast ions from laser-produced Sn plasma for an extreme ultraviolet lithography source", Applied Physics Letters, vol. 89, pp. 111502-1-111502-3 (2006).

(Continued)

*Primary Examiner* — Nikita Wells
(74) *Attorney, Agent, or Firm* — McDermott Will & Emery LLP

(57) ABSTRACT

An extreme ultraviolet light generation apparatus used in combination with a laser system, the apparatus may include: a chamber provided with at least one inlet port for introducing a laser beam outputted from the laser system into the chamber; a target supply unit provided to the chamber for supplying a target material to a predetermined region inside the chamber, where the target material is irradiated with the laser beam; at least one optical element disposed inside the chamber; a magnetic field generation unit for generating a magnetic field around the predetermined region; an ion collection unit disposed in a direction of a line of magnetic force of the magnetic field for collection an ion which is generated when the target material is irradiated with the laser beam and is flowing along the line of magnetic force; and a gas introduction unit for introducing an etching gas into the chamber.

13 Claims, 20 Drawing Sheets

(56) References Cited

U.S. PATENT DOCUMENTS

| | | |
|---|---|---|
| 4,251,781 A | 2/1981 | Sutter, Jr. |
| 4,414,488 A | 11/1983 | Hoffmann et al. |
| 4,455,658 A | 6/1984 | Sutter, Jr. |
| 4,546,482 A | 10/1985 | Bagaglia et al. |
| 4,686,682 A | 8/1987 | Haruta et al. |
| 4,703,490 A | 10/1987 | Brumme et al. |
| 4,742,527 A | 5/1988 | Wiedemann et al. |
| 4,774,714 A | 9/1988 | Javan |
| 4,860,300 A | 8/1989 | Baumler et al. |
| 4,866,682 A | 9/1989 | Uchihashi et al. |
| 4,876,693 A | 10/1989 | Lucero et al. |
| 4,953,174 A | 8/1990 | Eldridge et al. |
| 4,959,840 A | 9/1990 | Akins et al. |
| 5,023,884 A | 6/1991 | Akins et al. |
| 5,025,445 A | 6/1991 | Anderson et al. |
| 5,025,446 A | 6/1991 | Kuizenga |
| 5,048,041 A | 9/1991 | Akins et al. |
| 5,070,513 A | 12/1991 | Letardi |
| 5,187,716 A | 2/1993 | Haruta et al. |
| 5,189,678 A | 2/1993 | Ball et al. |
| 5,247,534 A | 9/1993 | Muller-Horsche |
| 5,313,481 A | 5/1994 | Cook et al. |
| 5,315,611 A | 5/1994 | Ball et al. |
| 5,359,620 A | 10/1994 | Akins |
| 5,448,580 A | 9/1995 | Birx et al. |
| 5,471,965 A | 12/1995 | Kapich |
| 5,535,233 A | 7/1996 | Mizoguchi et al. |
| 5,557,629 A | 9/1996 | Mizoguchi et al. |
| 5,646,954 A | 7/1997 | Das et al. |
| 5,729,565 A | 3/1998 | Meller et al. |
| 5,763,930 A | 6/1998 | Partlo |
| 5,771,258 A | 6/1998 | Morton et al. |
| 5,852,621 A | 12/1998 | Sandstrom |
| 5,863,017 A | 1/1999 | Larson et al. |
| 5,875,207 A | 2/1999 | Osmanow |
| 5,940,421 A | 8/1999 | Partlo et al. |
| 5,953,360 A | 9/1999 | Vitruk et al. |
| 6,005,879 A | 12/1999 | Sandstrom et al. |
| 6,016,325 A | 1/2000 | Ness et al. |
| 6,018,537 A | 1/2000 | Hofmann et al. |
| 6,028,880 A | 2/2000 | Carlesi et al. |
| 6,034,978 A | 3/2000 | Ujazdowski et al. |
| 6,051,841 A | 4/2000 | Partlo |
| 6,064,072 A | 5/2000 | Partlo et al. |
| 6,067,311 A | 5/2000 | Morton et al. |
| 6,094,448 A | 7/2000 | Fomenkov et al. |
| 6,104,735 A | 8/2000 | Webb |
| 6,109,574 A | 8/2000 | Pan et al. |
| 6,128,323 A | 10/2000 | Myers et al. |
| 6,151,349 A | 11/2000 | Gong et al. |
| 6,164,116 A | 12/2000 | Rice et al. |
| 6,192,064 B1 | 2/2001 | Algots et al. |
| 6,208,674 B1 | 3/2001 | Webb et al. |
| 6,208,675 B1 | 3/2001 | Webb |
| 6,212,211 B1 | 4/2001 | Azzola et al. |
| 6,219,368 B1 | 4/2001 | Govorkov |
| 6,240,117 B1 | 5/2001 | Gong et al. |
| 6,317,447 B1 | 11/2001 | Partlo et al. |
| 6,365,894 B2 | 4/2002 | Tadokoro et al. |
| 6,414,979 B2 | 7/2002 | Ujazdowski et al. |
| 6,452,199 B1 | 9/2002 | Partlo et al. |
| 6,466,602 B1 | 10/2002 | Fleurov et al. |
| 6,477,193 B2 | 11/2002 | Oliver et al. |
| 6,493,374 B1 | 12/2002 | Fomenkov et al. |
| 6,541,786 B1 | 4/2003 | Partlo et al. |
| 6,549,551 B2 | 4/2003 | Ness et al. |
| 6,556,612 B2 | 4/2003 | Ershov et al. |
| 6,567,450 B2 | 5/2003 | Myers et al. |
| 6,576,912 B2 | 6/2003 | Visser et al. |
| 6,618,421 B2 | 9/2003 | Das et al. |
| 6,625,191 B2 | 9/2003 | Knowles et al. |
| 6,635,844 B2 | 10/2003 | Yu |
| 6,693,939 B2 | 2/2004 | Klene et al. |
| 6,782,031 B1 | 8/2004 | Hofmann et al. |
| 6,928,093 B2 | 8/2005 | Webb et al. |
| 6,972,421 B2 | 12/2005 | Melnychuk et al. |
| 7,002,168 B2 | 2/2006 | Jacob et al. |
| 7,068,697 B1 | 6/2006 | Amada et al. |
| 7,087,914 B2 | 8/2006 | Akins et al. |
| 7,135,693 B2 | 11/2006 | Roux |
| 7,164,144 B2 | 1/2007 | Partlo et al. |
| 7,196,342 B2 | 3/2007 | Ershov et al. |
| 7,217,940 B2 | 5/2007 | Partlo et al. |
| 7,217,941 B2 | 5/2007 | Rettig et al. |
| 7,230,258 B2 | 6/2007 | Ruzic et al. |
| 7,251,012 B2 | 7/2007 | Banine et al. |
| 7,271,401 B2 | 9/2007 | Imai et al. |
| 7,315,346 B2 | 1/2008 | Van Beek et al. |
| 7,323,703 B2 | 1/2008 | Oliver et al. |
| 7,355,672 B2 | 4/2008 | Van Herpen et al. |
| 7,361,918 B2 | 4/2008 | Akins et al. |
| 7,365,349 B2 | 4/2008 | Partlo et al. |
| 7,368,741 B2 | 5/2008 | Melnychuk et al. |
| 7,372,056 B2 | 5/2008 | Bykanov et al. |
| 7,378,673 B2 | 5/2008 | Bykanov et al. |
| 7,394,083 B2 | 7/2008 | Bowering et al. |
| 7,405,416 B2 | 7/2008 | Algots et al. |
| 7,415,056 B2 | 8/2008 | Das et al. |
| 7,423,275 B2 | 9/2008 | Lee et al. |
| 7,439,530 B2 | 10/2008 | Ershov et al. |
| 7,453,077 B2 | 11/2008 | Bowering et al. |
| 7,525,111 B2 | 4/2009 | Bowering |
| 7,626,188 B2 * | 12/2009 | Shirai et al. ............... 250/504 R |
| 7,655,925 B2 | 2/2010 | Bykanov et al. |
| 7,671,349 B2 | 3/2010 | Bykanov et al. |
| 7,812,329 B2 | 10/2010 | Bykanov et al. |
| 7,872,245 B2 | 1/2011 | Vaschenko et al. |
| 7,897,947 B2 | 3/2011 | Vaschenko |
| 7,999,241 B2 | 8/2011 | Nagai et al. |
| 8,003,963 B2 | 8/2011 | Nagai et al. |
| 8,242,474 B2 * | 8/2012 | Nagai et al. ............... 250/504 R |
| 2005/0016679 A1 | 1/2005 | Ruzic et al. |
| 2005/0140945 A1 | 6/2005 | Banine et al. |
| 2005/0205810 A1 | 9/2005 | Akins et al. |
| 2005/0259709 A1 | 11/2005 | Das et al. |
| 2005/0279946 A1 | 12/2005 | Rettig et al. |
| 2006/0012761 A1 | 1/2006 | Bakker et al. |
| 2006/0175558 A1 | 8/2006 | Bakker et al. |
| 2006/0219957 A1 | 10/2006 | Ershov et al. |
| 2006/0249699 A1 | 11/2006 | Bowering et al. |
| 2006/0250599 A1 | 11/2006 | Bakker et al. |
| 2006/0255298 A1 | 11/2006 | Bykanov et al. |
| 2007/0001131 A1 | 1/2007 | Ershov et al. |
| 2007/0023709 A1 | 2/2007 | Kanazawa et al. |
| 2007/0102653 A1 | 5/2007 | Bowering et al. |
| 2007/0145297 A1 | 6/2007 | Freriks et al. |
| 2007/0158594 A1 | 7/2007 | Shirai et al. |
| 2007/0228298 A1 | 10/2007 | Komori et al. |
| 2007/0291279 A1 | 12/2007 | Rafac |
| 2007/0291350 A1 | 12/2007 | Ershov et al. |
| 2008/0035865 A1 | 2/2008 | Komori et al. |
| 2008/0043321 A1 | 2/2008 | Bowering et al. |
| 2008/0048133 A1 | 2/2008 | Bykanov et al. |
| 2008/0087840 A1 | 4/2008 | Ueno et al. |
| 2008/0087847 A1 | 4/2008 | Bykanov et al. |
| 2008/0149862 A1 | 6/2008 | Hansson et al. |
| 2008/0179548 A1 | 7/2008 | Bykanov et al. |
| 2009/0272917 A1 | 11/2009 | Soer et al. |
| 2010/0032590 A1 | 2/2010 | Bykanov et al. |
| 2011/0170079 A1 | 7/2011 | Banine et al. |
| 2011/0284775 A1 * | 11/2011 | Ueno et al. ............... 250/504 R |
| 2012/0223257 A1 * | 9/2012 | Nagai et al. ............... 250/504 R |

FOREIGN PATENT DOCUMENTS

| | | |
|---|---|---|
| EP | 1491963 A2 | 12/2004 |
| EP | 1674932 A1 | 6/2006 |
| JP | 2005-197456 | 7/2005 |
| JP | 2006-329664 A | 12/2006 |
| JP | 2007-220949 A | 8/2007 |
| JP | 2007-266234 | 10/2007 |
| JP | 2007-317598 A | 12/2007 |
| WO | 03087867 A2 | 10/2003 |

(56) References Cited

FOREIGN PATENT DOCUMENTS

| WO | 2004092693 | A2 | 10/2004 |
| WO | 2005064401 | A2 | 7/2005 |
| WO | 2005/091879 | A2 | 10/2005 |

OTHER PUBLICATIONS

Hershcovitch, "Highpressure arcs as vacuumatmosphere interface and plasma lens for nonvacuum electron beam welding machines, electron beam melting, and nonvacuum ion material modification", Journal of Applied Physics, vol. 78, pp. 5283-5288, (1995).

Harilal et al., "Ambient gas effects on the dynamics of laser-produced tin plume expansion", Journal of Applied Physics, vol. 99, pp. 083303-1-083303-10, (2006).

Harilal et al., "Debris mitigation in a laser-produced tin plume using a magnetic field", Journal of Applied Physics, vol. 98, pp. 036102-036102-3, (2005).

Harilal et al., "Spectroscopic characterization of laser-induced tin plasma", Journal of Applied Physics, vol. 98, pp. 013306-1-013306-7 (2005).

Tillack et al., "Debris mitigation for solid target LPP-Recent results at UCSD", EUV Source Workshop at UC San Diego, Nov. 10, 2005.

Tao et al., "Mass-limited Sn target irradiated by dual laser pulses for an extreme ultraviolet lithography source", Optics Letters/vol. 32, No. 101 May 15, 2007, pp. 1338-1340.

Harilal et al., "Ion debris mitigation from tin plasma using ambient gas, magnetic field and combined effects", Applied Physics B—Lasers and Optics, vol. 86, pp. 547-553, (2007).

Wang et al., "2-D Magnetic Circuit Analysis for a Permanent Magnet Used in Laser Ablation Plume Expansion Experiments", Fusion Division Center for Energy Research, University of California, San Diego, UCSD-LPLM-02-04, Dec. 5, 2002.

Tao et al., "Characterizing and optimizing the density profile of double-pulse laser-produced Sn-based plasmas to enhance conversion efficiency and mitigate debris for an EUVL source", Center for Energy Research, University of California, San Diego, UCSD-CER-05-07, Sep. 2005.

\* cited by examiner

EXTREME ULTRAVIOLET LIGHT GENERATION APPARATUS

CROSS-REFERENCE TO RELATED APPLICATION

This application is a division of U.S. application Ser. No. 13/032,172, filed on Feb. 22, 2011, now U.S. Pat. No. 8,242,474, and claims the benefit of priority from the Japanese Patent Application No. 2010-036046 filed on Feb. 22, 2010 and Japanese Patent Application No. 2010-294239 filed on Dec. 28, 2010; the entire contents of which are incorporated herein by reference.

BACKGROUND

1. Technical Field

The present disclosure relates to an extreme ultraviolet (EUV) light generation apparatus in which a target material is irradiated with a laser beam to thereby generate the EUV light.

2. Related Art

In recent years, as semiconductor processes become finer, photolithography has been making rapid progress toward finer fabrication. In the next generation, microfabrication at 70 nm to 45 nm, further, microfabrication at 32 nm and beyond will be required. Accordingly, in order to fulfill the requirement for microfabrication at 32 nm and beyond, for example, an exposure device is expected to be developed where an EUV light generation apparatus for generating EUV light having a wavelength of approximately 13 nm is combined with reduced projection reflective optics.

As the EUV light generation apparatus, there are three kinds of light generation apparatuses, which include an LPP (laser produced plasma) type light generation apparatus using plasma generated by irradiating a target material with a laser beam, a DPP (discharge produced plasma) type light generation apparatus using plasma generated by electric discharge, and an SR (synchrotron radiation) type light generation apparatus using orbital radiation.

SUMMARY

An EUV light generation apparatus in accordance with one aspect of the present disclosure is used in combination with a laser system, and the apparatus may include: a chamber provided with at least one inlet port for introducing a laser beam outputted from the laser system into the chamber; a target supply unit provided to the chamber for supplying a target material to a predetermined region inside the chamber, where the target material is irradiated with the laser beam; at least one optical element disposed inside the chamber; a magnetic field generation unit for generating a magnetic field around the predetermined region; an ion collection unit disposed in a direction of a line of magnetic force of the magnetic field for collection an ion generated when the target material is irradiated with the laser beam and flowing along the line of magnetic force; and a gas introduction unit for introducing an etching gas into the chamber.

These and other objects, features, aspects, and advantages of the present disclosure will become apparent to those skilled in the art from the following detailed description, which, taken in conjunction with the annexed drawings, discloses preferred embodiments of the present disclosure.

DESCRIPTION OF PREFERRED EMBODIMENTS

Hereinafter, embodiments for implementing the present disclosure will be described in detail with reference to the accompanying drawings. In the subsequent description, each drawing merely illustrates shape, size, and positional relationship of members schematically to the extent that enables the content of the present disclosure to be understood. Accordingly, the present disclosure is not limited to the shape, the size, and the positional relationship of the members illustrated in each drawing. In order to simplify the drawings, a part of hatching along a section is omitted. Further, numerical values indicated hereafter are merely preferred examples of the present disclosure. Accordingly, the present disclosure is not limited to the indicated numerical values.

First Embodiment

Figure 1:
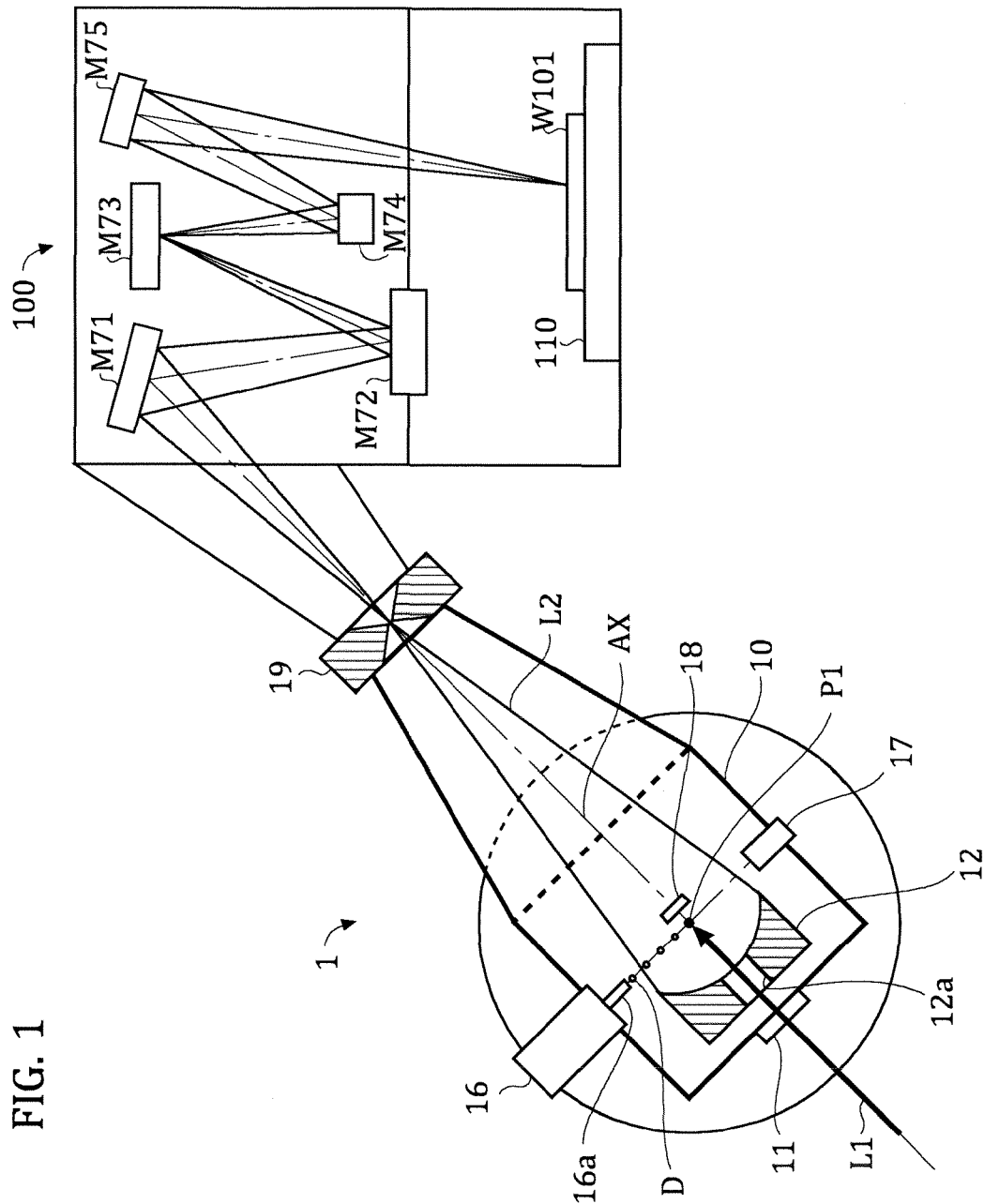
FIG. 1 is a sectional view illustrating a schematic configuration of an exposure device and an EUV light generation apparatus in accordance with a first embodiment of the present disclosure.

First, an EUV light generation apparatus in accordance with a first embodiment of the present disclosure will be described in detail with reference to the drawings. FIG. 1 is a sectional view illustrating a schematic configuration of an exposure device and the EUV light generation apparatus in accordance with the first embodiment. As shown in FIG. 1, an EUV light generation apparatus 1 in accordance with the first embodiment includes a well-sealed chamber 10, a droplet generator 16 for supplying a target material in a form of a liquid droplet (droplet D) toward a plasma generation site P1 located at substantially the center of the chamber 10, and a droplet collection unit 17 for collecting a droplet which has passed the plasma generation site P1. The chamber 10 may be provided with an exhaust pump (not shown).

The droplet generator 16 stores a liquid-state target material, such as molten tin (Sn), which serves as a material for generating EUV light, and is provided with a nozzle 16a having an opening at its tip facing toward the plasma generation site P1. The liquid-state target material stored in the droplet generator 16 is outputted as a liquid droplet D through the nozzle 16a toward the plasma generation site P1. It is to be noted that the target material is not limited to the molten Sn, and various molten metals or other materials may be employed in accordance with a desired wavelength of EUV light to be obtained. Further, a target is not limited to a liquid target, but a solid target may be used.

As shown in FIG. 1, the EUV light generation apparatus 1 includes an EUV collector mirror 12 that selectively reflects EUV light emitted at the plasma generation site P1. A laser beam L1 outputted from a driver laser device (not shown) enters the chamber 10 through a window 11 in synchronized timing as the droplet D arrives at the plasma generation site P1. The laser beam L1, traveling through a through-hole 12a provided at substantially the center of the EUV collector mirror 12 from a rear side (opposite side of the reflective side) of the EUV collector mirror 12, is focused by a focusing optical system (not shown) on the droplet D at the plasma generation site P1. With this, the droplet D is ionized and turned into plasma around the plasma generation site P1, and EUV light L2 is emitted from this plasma. A beam dump 18 for preventing the laser beam L1 from entering into an exposure device 100 may be provided to an opposite side from the EUV collector mirror 12 on an axis AX.

The EUV light L2 emitted at the plasma generation site P1 is selectively reflected by the EUV collector mirror 12. When the EUV collector mirror 12, for example, is an ellipsoidal concave mirror having a first focus and a second focus, the EUV collector mirror 12 is disposed such that the first focus coincides with the plasma generation site P1 where the EUV light is emitted and the second focus coincides with an intermediate focus IF where the reflected EUV light is focused. With this configuration, the EUV light emitted at the plasma generation site P1 can be imaged at the intermediate focus IF. The configuration is such that the intermediate focus IF is located inside an exposure device connection unit 19 which serves to connect the EUV light generation apparatus 1 and the exposure device 100. Accordingly, the EUV light L2 generated at the plasma generation site P1, having been selectively reflected by the EUV collector mirror 12, is focused at the intermediate focus IF inside the exposure device connection unit 19. Note that although a beam axis of the laser beam L1 coincides with the axis AX of the EUV light L2 in this embodiment, they do not necessarily have to coincide with each other.

The EUV light L2 focused at the intermediate focus IF is thereafter introduced into the exposure device 100. In the exposure device 100, a stage 110 which is movable horizontally and which holds a workpiece W101, such as a semiconductor substrate or a glass substrate, to be processed, and an exposure optical system including one or more mirrors M71 through M75 and a reflective mask M73 which shapes the profile of the inputted EUV light L2 to a pattern to be transferred and focuses the EUV light L2 on the workpiece W101 on the stage 110. Thus, the pattern on the mask M73 by the EUV light L2 having propagated through the exposure optical system is imaged on the workpiece W101, whereby a desired pattern is transferred. More specifically, the exposure device 100 includes an illumination optical system for illuminating the mask M73, and a reduced projection optical system for performing reduced projection of the mask pattern on the mask M73 and images onto the workpiece W101 such as a wafer. The illumination optical system includes the mirrors M71 and M72 and illuminates the reflective mask M73. The reduced projection optical system includes the mirrors M74 and M75 and images the mask pattern on the reflective mask M73 onto the workpiece W101.

Figure 2:
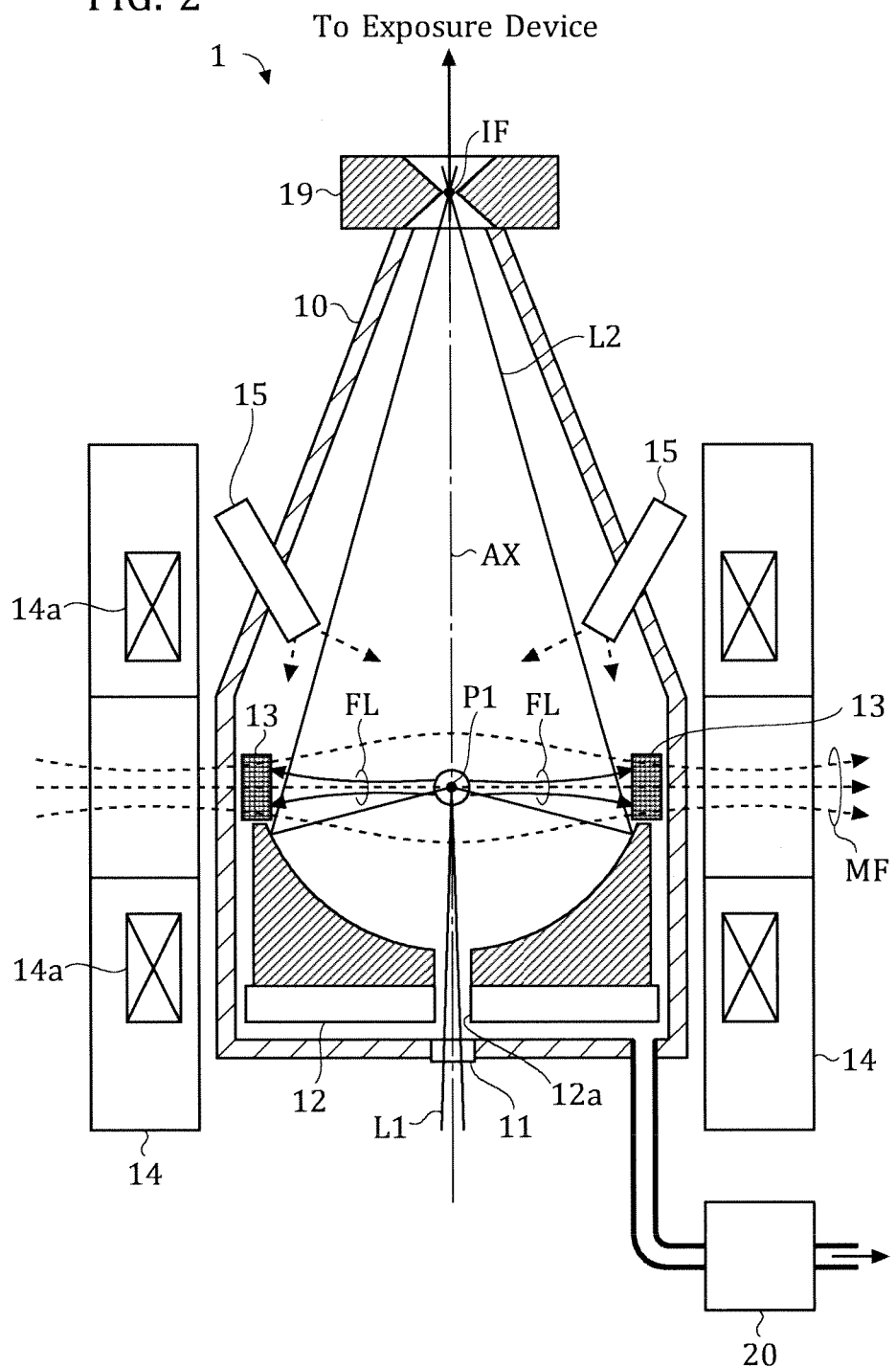
FIG. 2 is a sectional view illustrating a schematic configuration of the EUV light generation apparatus in accordance with the first embodiment.

FIG. 2 is a sectional view illustrating a schematic configuration of the EUV light generation apparatus in accordance with the first embodiment. FIG. 2, however, is a section taken along a plane containing the axis AX and along a plane different from that shown in FIG. 1. As shown in FIG. 2, the EUV light generation apparatus 1 includes, in addition to the configuration shown in FIG. 1, a pair of magnets 14 disposed outside the chamber 10, a pair of ion collection units 13 disposed on a central line of magnetic force lines MF of a magnetic field generated by the pair of magnets 14, and an exhaust pump 20 for maintaining the pressure inside the chamber low.

The magnets 14, for example, are superconducting electromagnets constituting a magnetic field generation unit, and a magnetic field in a range of 0 through approximately 2 T (tesla) can be generated steadily in a large space by applying current to coils 14a thereof. The pair of magnets 14 is disposed such that they face each other with the plasma generation site P1 located therebetween and such that they are coaxially aligned with their axes passing though the plasma generation site P1. Thus, a charged particle such as an Sn ion generated around the plasma generation site P1 (hereinafter simply referred as ionized debris) is trapped in the magnetic field generated so as to pass through the plasma generation site P1. The trapped ionized debris is subjected to the Lorentz force from the magnetic field, and travels along the magnetic force lines MF revolving around the magnetic force lines MF. With this, an ion flow FL of which a sectional area along a plane perpendicular to the direction of the magnetic force lines MF is limited within a certain range is formed. The ion flow FL flows in two directions along the direction of the magnetic field away from the plasma generation site P1.

Further, a pair of ion collection units 13 is disposed on the central line of the magnetic force lines MF of the magnetic field generated by the pair of magnets 14 at positions where the ion collection units 13 face each other with the plasma generation site P1 located therebetween. The ionized debris generated around the plasma generation site P1 and having been turned into the ion flow FL, being trapped in the magnetic field, flows along the magnetic force lines MF, to thereby be collected into either one of the ion collection units 13.

Further, as shown in FIG. 2, the EUV light generation apparatus 1 includes an etching gas introduction unit 15 disposed to face an optical element such as a reflective surface of the EUV collector mirror 12 disposed inside the chamber 10. The etching gas introduction unit introduces an etching gas into the chamber 10 for etching a deposited target material (Sn). The target material deposited on the optical element reacts with the etching gas introduced by the etching gas introduction unit to thereby be removed. As the etching gas, hydrogen ($H_2$) gas, halogen gas such as F, Cl, and Br, or a gas containing the above may be used. When, for example, Sn is used as the target material and hydrogen gas is used as the etching gas, Sn deposited on the optical element reacts with hydrogen to generate gaseous $SnH_4$, to thereby be removed off a surface of the optical element. Note that the gas (such as $SnH_4$) generated through a reaction between the target material and the etching gas may be discharged from the chamber 10 by the exhaust pump 20 or the like connected to the chamber 10.

A free radical source for dissociating (turning into a free radical) the etching gas may be provided around an outlet port of the etching gas introduction unit 15. Examples of the free radical source include a plasma source, W-filament, and microwave. With this, the etching gas can be supplied into the chamber 10 as a free radical particle having a high reactivity with the deposited target material. This makes it possible to efficiently remove the target material deposited on the optical element inside the chamber 10. When, for example, hydrogen gas is used as the etching gas and Sn is used as the target material, a hydrogen radical and Sn react efficiently to thereby generate gaseous $SnH_4$. Here, hydrogen gas may be turned into a hydrogen radical with light having a wavelength of ultraviolet or the like emitted at the plasma generation site P1.

Figure 3:
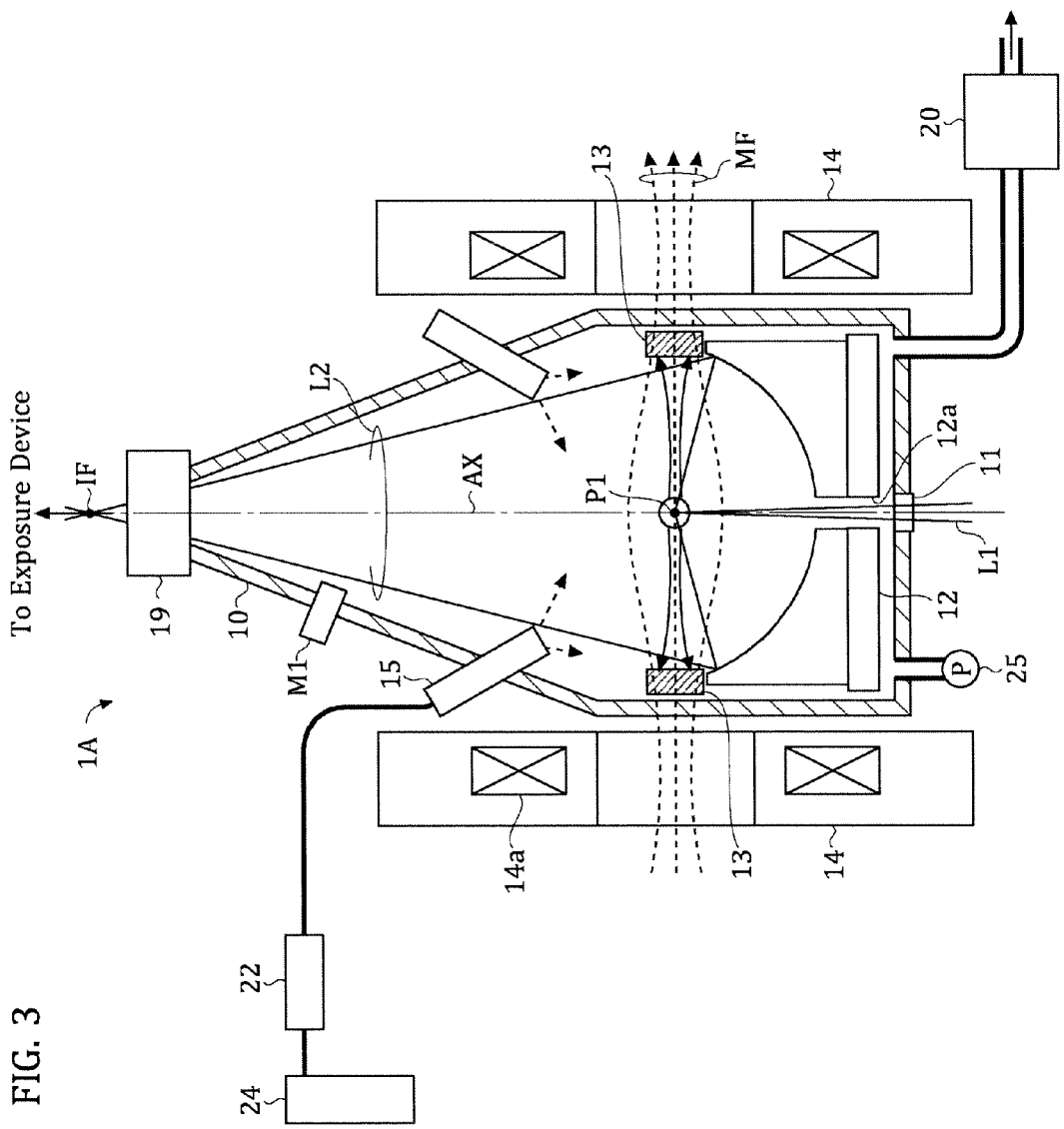
FIG. 3 is a sectional view illustrating a schematic configuration of the EUV light generation apparatus in accordance with the first embodiment, to which a unit for introducing an etching gas into a chamber and a sensor for detecting pressure inside the chamber are added.

FIG. 3 is a sectional view illustrating a schematic configuration of the EUV light generation apparatus in accordance with the first embodiment, to which a unit for introducing the etching gas into the chamber and a sensor for detecting pressure inside the chamber are added. The unit for introducing the etching gas includes an etching gas tank 24, a mass flow controller MFC22 for controlling a flow rate of the etching gas, and the etching gas introduction unit 15. Further, the chamber 10 is provided, via piping, with a pressure sensor 25 for measuring the pressure inside the chamber. With an EUV light generation apparatus 1A configured as such, the pressure inside the chamber 10 can be regulated by adjusting the flow rate of the etching gas or a discharge rate of the exhaust pump.

Figure 4:
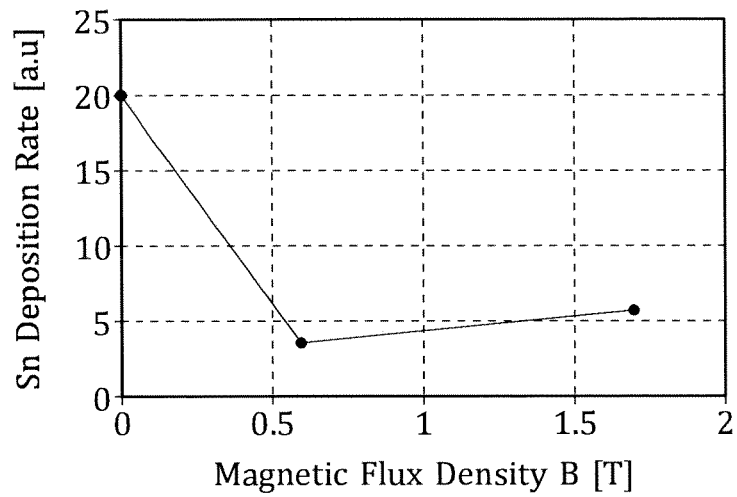
FIG. 4 is a graph showing a relationship between a magnetic flux density and a deposition rate of Sn in a case where an etching gas is not introduced into the chamber.

FIG. 4 is a graph showing a relationship between a magnetic flux density generated at the plasma generation site P1 and a deposition rate of Sn to be deposited on a surface of the EUV collector mirror 12, in a case where the etching gas is not introduced into the chamber. In FIG. 4, the vertical axis represents the deposition rate of Sn, and the horizontal axis represents the magnetic flux density indicating the strength of the magnetic field. When the magnetic flux density is between 0 T and 0.5 T, the deposition rate of Sn has monotonically decreased. On the other hand, in a region where the magnetic flux density is at or above 0.5 T, the deposition rate of Sn has been substantially constant. Based on this result, it is contemplated that the ionized debris is trapped in the magnetic field when the magnetic flux density is in a range between 0 and 0.5 T. It is also contemplated, however, that neutral particles and minute particles which are not charged and cannot be trapped in the magnetic field are deposited when the magnetic flux density is at or above 0.5 T.

Thus, in order to etch the deposited Sn of the uncharged neutral particles and minutes particles, hydrogen gas containing hydrogen radicals has been introduced as the etching gas into the vacuum chamber. In this example, hydrogen gas has been passed through a free radical source 15A for turning the hydrogen gas into free radicals, whereby a mixed gas of the hydrogen gas and the hydrogen radicals has been introduced into the chamber.

Figure 5:
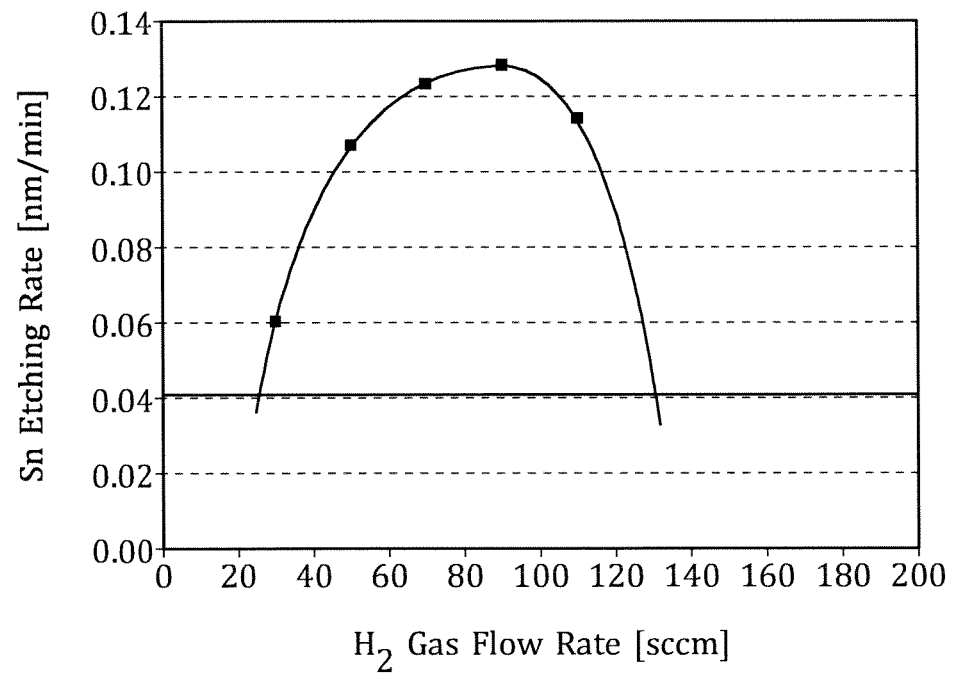
FIG. 5 is a graph showing a relationship between a flow rate of hydrogen gas and an etching rate of Sn on a surface of an EUV collector mirror.

FIG. 5 shows a relationship between the flow rate of the hydrogen gas and the etching rate of Sn on the surface of the EUV collector mirror 12. The vertical axis represents the etching rate (nm/min) of Sn, and the horizontal axis represents the mass flow rate (sccm) of the hydrogen gas. Note that the etching rate of Sn was measured under the condition where the pressure inside the chamber was at or below 10 Pa. When, for example, the deposition rate of Sn on the surface of the EUV collector mirror 12 is at 0.04 nm/min, adjusting the mass flow rate of the hydrogen gas to a range between 25 sccm and 131 sccm prevents Sn from being deposited on the surface of the EUV collector mirror 12.

Next, a description will be provided below that as the pressure inside the chamber 10 increases, the trapping effect of ions by the magnetic field decreases. When the gas pressure inside the chamber 10 (hereinafter referred to as chamber pressure) is increased, collision between the ionized debris traveling along the magnetic force lines MF and molecules (or atoms) inside the chamber 10 occurs frequently. As a result, the ionized debris that is trapped in the magnetic field and travels therein deviates largely from the path extending along the magnetic force lines MF, and diffuses to the outside with respect to the central line of the magnetic field. That is, as the chamber pressure is increased, the cross sectional area of the ion flow FL flowing in the direction of the magnetic field increases. As the chamber pressure is further increased, the stopping distance of the traveling ions becomes shorter, whereby the ions cannot be collected.

Figure 6:
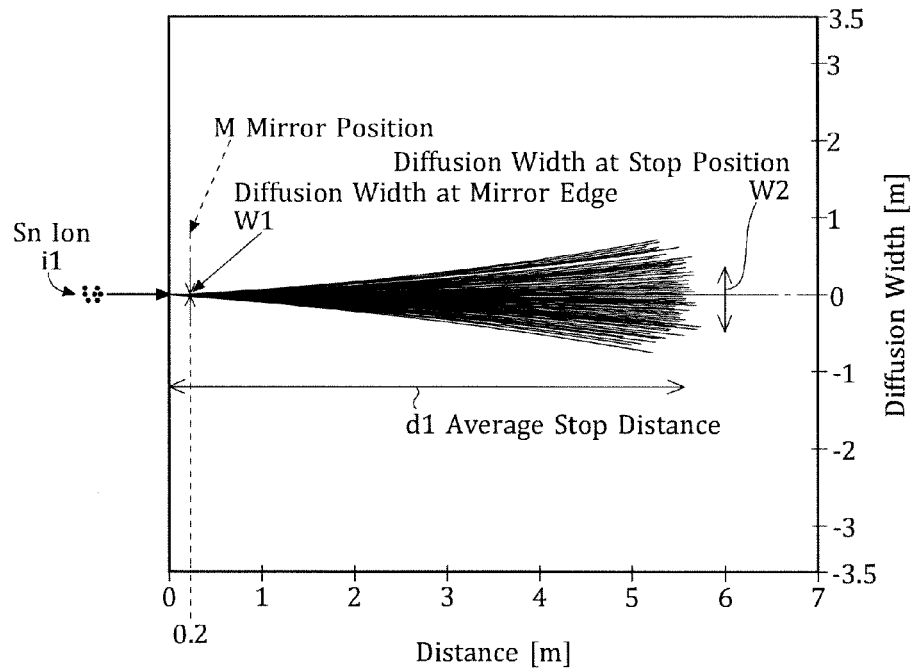
FIG. 6 is a diagram showing a result of a Monte Carlo simulation (SRIM) for finding a trajectory of an Sn ion under hydrogen gas atmosphere in accordance with the first embodiment.
Figure 7:
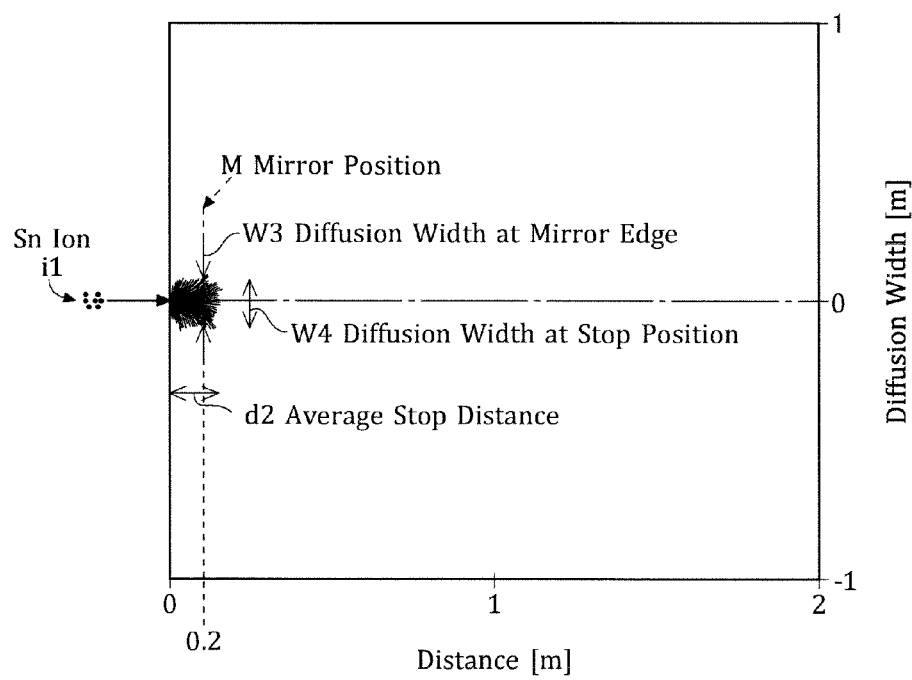
FIG. 7 is a diagram showing a result of a Monte Carlo simulation (SRIM) for finding a trajectory of an Sn ion under Xe gas atmosphere in accordance with the first embodiment.

Here, the diffusion width of the ionized debris caused by colliding with the molecules (or atoms) depends on the atmosphere gas inside the chamber 10, particularly on the type and the pressure of the etching gas introduced into the chamber 10. FIG. 6 shows a result of a Monte Carlo simulation (SRIM) for finding a trajectory of an Sn ion when the Sn ion of 1 key enters the hydrogen gas atmosphere where the gas pressure is 1 Pa and the magnetic field having the magnetic flux density of 0.6 T in the direction of entry. Further, FIG. 7 shows a result of a Monte Carlo simulation (SRIM) for finding a trajectory of an Sn ion when the Sn ion of 0.01 keV enters the Xe gas atmosphere where the gas pressure is 1 Pa and the magnetic field having the magnetic flux density of 0.6 T in the direction of entry. Note that in FIG. 6 and FIG. 7, the horizontal axis represents the distance in the direction of entry, that is, the moving distance in the direction of entry, and the vertical axis represents the moving distance in the direction perpendicular to the direction of entry, that is, the diffusion width σ.

First, as shown in FIG. 6, the Sn ion that has entered the hydrogen gas atmosphere is not diffused substantially when the moving distance is around a few hundred millimeters, but as it travels in the hydrogen gas, the diffusion width σ increases. On the other hand, the Sn ion that has entered the Xe gas atmosphere is largely diffused immediately after it has entered the Xe gas, and it stops without moving much. Further, while the stopping distance of the Sn ion in the direction of entry in the hydrogen gas is approximately 6 m, the stopping distance of the Sn ion in the direction of entry in the Xe gas is as short as approximately 300 mm at most. This is because the hydrogen molecule has sufficiently small mass with respect to the Sn ion, and thus the energy loss at collision is small; whereas, the Xe atom has substantially the same mass as the Sn ion, and thus the energy loss at collision is large. Based on these, it is contemplated that in order to prevent the ionized debris from being diffused, a gas that is relatively light in mass, such as hydrogen gas, is preferably used as the etching gas.

Figure 8:
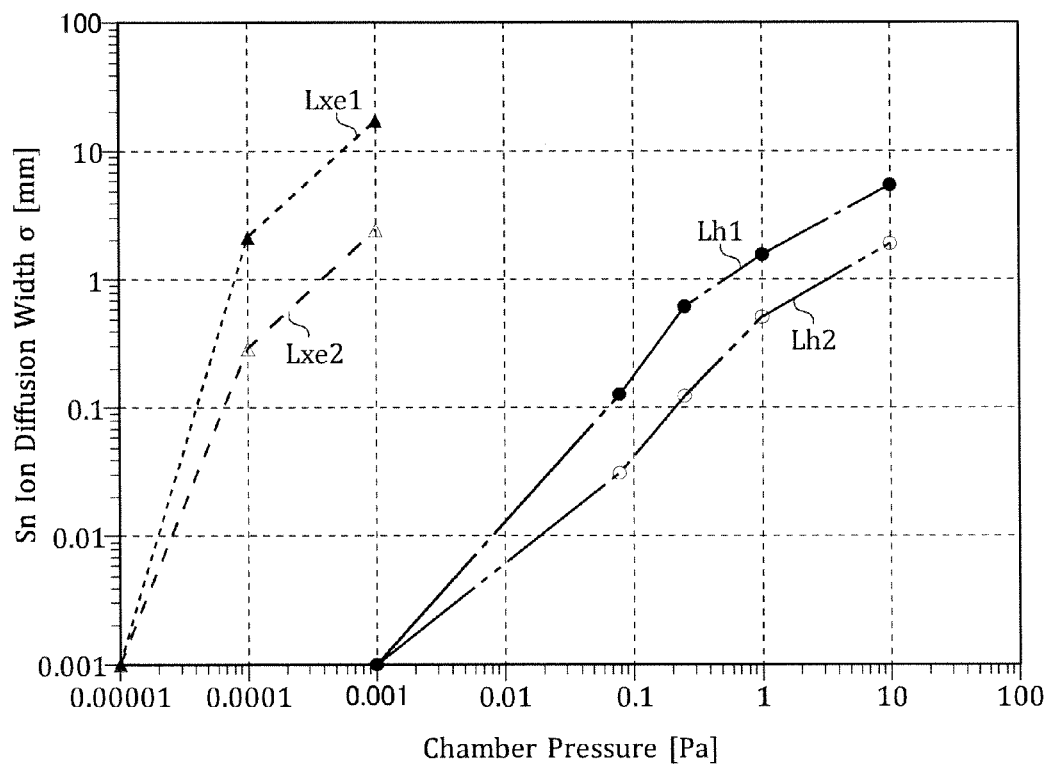
FIG. 8 is a graph showing a relationship between pressure inside the chamber and a diffusion width of an Sn ion found by Monte Carlo simulation (SRIM) in accordance with the first embodiment.

Further, FIG. 8 shows a relationship between the chamber pressure and the diffusion width of the Sn ion found by a Monte Carlo simulation (SRIM) in accordance with the first embodiment. In FIG. 8, a line Lh1 represents the dependency of the diffusion width σ on the chamber pressure in a case where hydrogen gas is used as the atmosphere gas and the moving distance of the Sn ion in the direction of entry is 100 mm, and a line Lh2 represents the dependency of the diffusion width σ on the chamber pressure in a case where hydrogen gas is used as the atmosphere gas and the moving distance of the Sn ion in the direction of entry is 200 mm. Further, a line Lxe1 represents the dependency of the diffusion width σ on the chamber pressure in a case where Xe gas is used as the atmosphere gas and the moving distance of the Sn ion in the direction of entry is 100 mm, and a line Lxe2 represents the dependency of the diffusion width σ on the chamber pressure in a case where Xe gas is used as the atmosphere gas and the moving distance of the Sn ion in the direction of entry is 200 mm.

As shown in FIG. 8, when the hydrogen gas is used as the atmosphere gas, the diffusion width σ is at or below 1 mm when the chamber pressure is approximately at or below $6 \times 10^{-1}$ Pa in the case where the moving distance in the direction of entry is 100 mm, or when the chamber pressure is approximately at or below 3 Pa in the case where the moving distance is 200 mm. On the other hand, when the Xe gas is used as the atmosphere gas, the diffusion width σ is at or below 1 mm when the chamber pressure is approximately at or below $3.5 \times 10^{-4}$ Pa in the case where the moving distance in the direction of entry is 100 mm, or when the chamber pressure is approximately at or below $8 \times 10^{-5}$ Pa when the moving distance is 200 mm. Here, a mass ratio of hydrogen gas to an Sn ion is sufficiently small with respect to a mass ratio of Xe gas to an Sn ion. Accordingly, using hydrogen gas as the atmosphere gas makes it possible to obtain substantially the same diffusion width σ as the case where the Xe gas is used as the atmosphere gas even when the chamber pressure is increased approximately by four orders. That is, using hydrogen gas as the atmosphere gas makes it possible to increase the chamber pressure without increasing the diffusion width σ, in comparison to the case where the Xe gas is used. Based on the above, it is contemplated that, in order to remove the deposited Sn more efficiently, hydrogen gas or hydrogen radical is preferably used as the etching gas. Note that Xe gas does not react with Sn; thus, Xe gas cannot be used as the etching gas. However, Xe gas is effective in stopping Sn debris having high energy.

Figure 9:
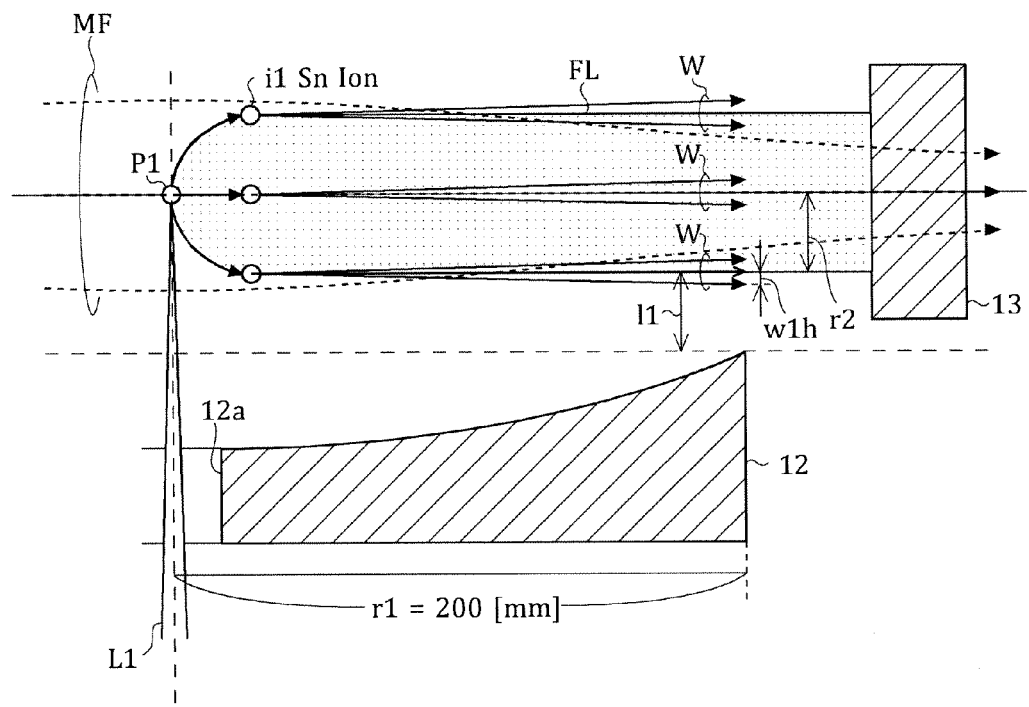
FIG. 9 illustrates an exemplary positional relationship among a plasma generation site, an EUV collector mirror, and an ion collection unit in accordance with the first embodiment.

Thus, in the first embodiment, the magnetic flux density B of the magnetic field generated around the plasma generation site P1 and the positional relationship of the EUV collector mirror 12 and the ion collection unit 13 with respect to the plasma generation site P1 are arranged as follows. FIG. 9 shows an exemplary positional relationship among the plasma generation site P1, the EUV collector mirror 12, and the ion collection unit 13 in accordance with the first embodiment. In the example shown in FIG. 9, hydrogen gas is used as the etching gas, Sn is used as the target material, the magnetic flux density B of the magnetic field generated around the plasma generation site P1 is 0.6 T, a radius r1 of the EUV collector mirror 12 is 200 mm, a distance l1 between an edge of the ion flow FL in the direction perpendicular to the direction of the magnetic field and an edge of the EUV collector mirror 12 is 6 mm. Note that when the magnetic flux density is 0.6 T, a radius r2 of the ion flow FL in a vacuum state is 25 mm. Further, the diffusion width of the Sn ion including a safety factor is designated by W1h.

Under this condition, when, for example, the safety factor is 3 (W1h=3σ) and the chamber pressure is at 10 Pa, the probability of an Sn ion being incident on the EUV collector mirror 12 is as small as $1.35 \times 10^{-3}$. Further, when, for example, the safety factor is 6 (W1$h$=6σ) and the chamber pressure is 4 Pa, the probability of an Sn ion being incident on the EUV collector mirror 12 is $1.78 \times 10^{-10}$, which is thus further improved. Furthermore, when, for example, the safety factor is 9 (W1$h$=9σ) and the chamber pressure is 2 Pa, the probability of an Sn ion being incident on the EUV collector mirror 12 is $1.13 \times 10^{-19}$, which is negligibly small.

Figure 10:
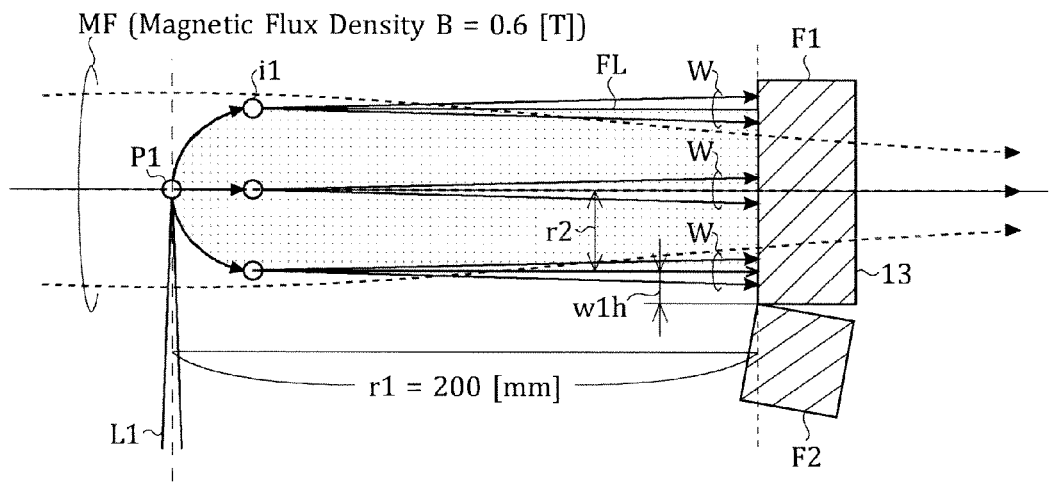
FIG. 10 is a diagram for describing an experiment in which an amount of ionized debris incident on each of the ion collection unit and the EUV collector mirror as shown in FIG. 9 is measured.
Figure 11:
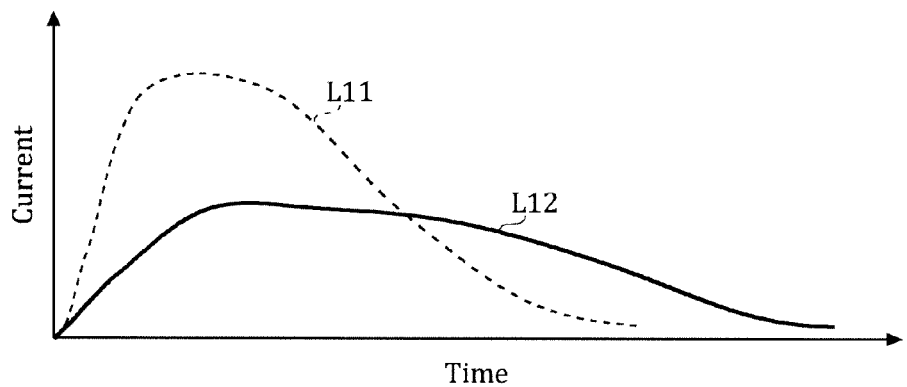
FIG. 11 is a diagram showing a temporal change in current flowing into Faraday cups disposed on an axis of a magnetic field in a case where the interior of the chamber is kept in vacuum and in a case where the interior of the chamber is under low-pressure hydrogen gas atmosphere as shown in FIG. 10.
Figure 12:
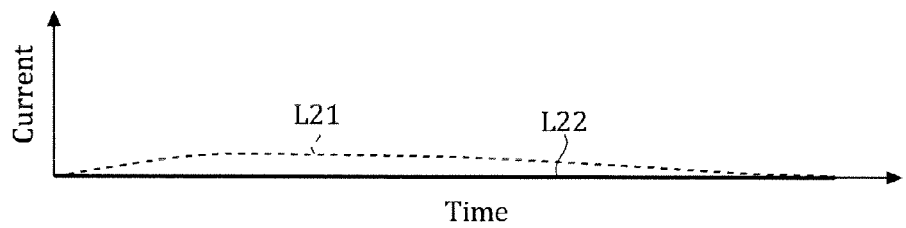
FIG. 12 is a diagram showing a temporal change in current flowing into Faraday cups disposed off an axis of a magnetic field in a case where the interior of the chamber is kept in vacuum and in a case where the interior of the chamber is under low-pressure hydrogen gas atmosphere as shown in FIG. 10.

Under the condition shown in FIG. 9, ionized debris incident on the ion collection unit 13 and ionized debris incident on the EUV collector mirror 12 were measured. FIG. 10 is a diagram for describing an experiment in which an amount of ionized debris incident on the ion collection unit 13 and on the EUV collector mirror 12 shown in FIG. 9 is measured. As shown in FIG. 10, in this experiment, a Faraday cup F1 is disposed in place of the ion collection unit 13, and a Faraday cup F2 is disposed in place of the edge of the EUV collector mirror 12. The Faraday cup F1 may be disposed at a location corresponding to the edge of the EUV collector mirror 12, as shown in FIG. 10. Further, FIG. 11 shows a temporal change in current flowing into the Faraday cup (F1) disposed on an axis of the magnetic field in a case where the interior of the chamber is kept in vacuum and in a case where the interior of the chamber is under low-pressure hydrogen gas atmosphere as shown in FIG. 10. FIG. 12 shows a temporal change in current flowing into the Faraday cup (F2) disposed off an axis of the magnetic field in a case where the interior of the chamber is kept in vacuum and in a case where the interior of the chamber is under low-pressure hydrogen gas atmosphere as shown in FIG. 10.

A line L11 shown in FIG. 11 represents a detected waveform in the Faraday cup F1 in a case where the chamber is kept in vacuum and the magnetic field with the magnetic flux density of 0.6 T is generated. Under this condition, relatively large, short pulsed current was detected in the Faraday cup F1. On the other hand, a line L22 shown in FIG. 12 represents a detected waveform in the Faraday cup F2 under the same condition as the above. Under this condition, pulsed current was not detected in the Faraday cup F2. Based on these, keeping the chamber in vacuum allows almost all ions to reach the Faraday cup F1. On the other hand, the ions do not reach the Faraday cup F2 corresponding to the EUV collector mirror 12. This indicates that the ionized Sn debris having high energy is not incident on the EUV collector mirror 12. In other words, compared to the current detected in the Faraday cup F1, the current detected in the Faraday cup F2 is sufficiently small, which indicates that almost all ionized debris can be collected in the Faraday cup F1 (corresponding to ion collection unit 13).

Meanwhile, a line L12 shown in FIG. 11 represents a detected waveform in the Faraday cup F1 in a case where hydrogen gas is introduced into the chamber 10 to increase the pressure thereinside and the magnetic field having the magnetic flux density of 0.6 T is generated. Under this condition, relatively large, short pulsed current was detected in the Faraday cup F1. On the other hand, a line L21 shown in FIG. 12 represents a detected waveform in the Faraday cup F2 under the same condition as the above. Under this condition, small, pulsed current was detected in the Faraday cup F2. This case corresponds to a case where the ionized Sn debris is incident on the EUV collector mirror.

Figure 13:
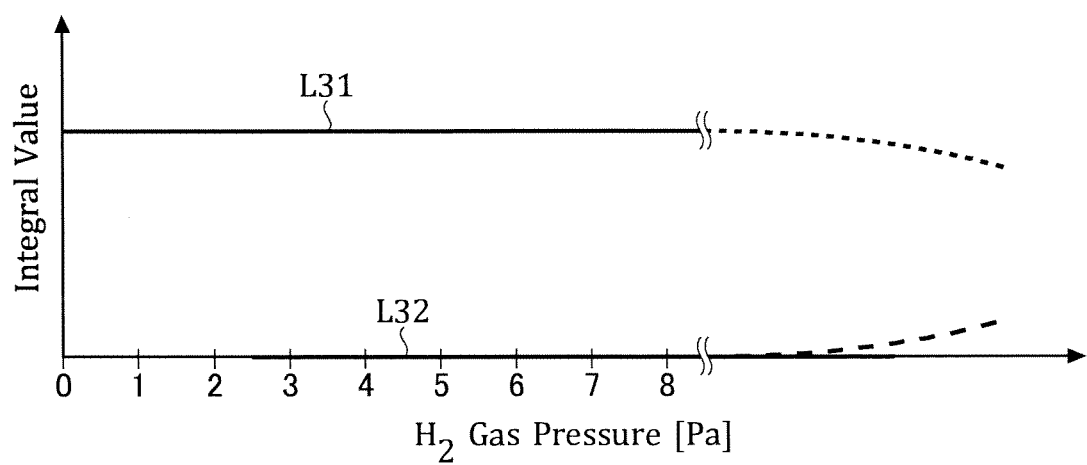
FIG. 13 is a diagram showing values of integral of current detected in each Faraday cup in a case where hydrogen gas pressure inside the chamber is varied as shown in FIG. 10.

FIG. 13 shows values of integral of current detected in each Faraday cup in a case where hydrogen gas pressure inside the chamber is varied as shown in FIG. 10. As shown in FIG. 13, when the hydrogen gas pressure is below 8 Pa, the values of integral of the current detected in the Faraday cups F1 and F2 shown in FIG. 10 do not change substantially. This indicates that the positional relationship with respect to the magnetic flux density B as shown in FIG. 9 enables to collect almost all generated ionized debris in the ion collection unit 13 while the chamber pressure containing hydrogen gas does not exceed at least 8 Pa. Accordingly, when hydrogen gas is used as the etching gas, keeping the hydrogen gas pressure inside the chamber 10 at least at or below 8 Pa allows to collect the ionized debris generated around the plasma generation site P1 using the magnetic field and to prevent a layer of the target material from being formed on the surface of the optical element inside the chamber 10. The above experimental result matched with the simulation result.

Figure 14:
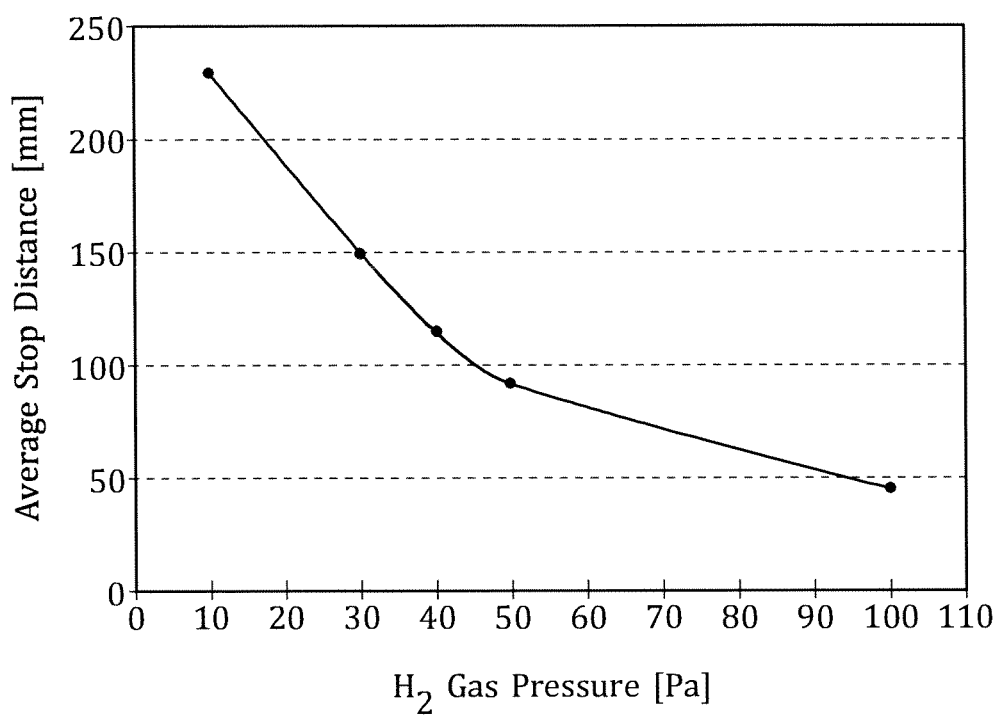
FIG. 14 is a graph showing a relationship between a stopping distance of an Sn ion and the hydrogen gas pressure.

Next, FIG. 14 is a graph showing a relationship between an averaged stopping distance of Sn ions and the hydrogen gas pressure. The vertical axis represents the averaged stopping distance (mm), and the horizontal axis represents the hydrogen gas pressure (Pa). The higher the hydrogen gas pressure is, the shorter the averaged stopping distance d1 is. For example, in order to trap Sn ions in the magnetic field at a position 200 mm away from the plasma generation site P1 to collect Sn, the hydrogen gas pressure needs to be at or below 15 Pa. Further, in order to trap the Sn ions in the magnetic field at a position 46 mm away from the plasma generation site P1 to collect Sn, the hydrogen gas pressure needs to be at or below 100 Pa.

As described above, in the first embodiment, the distance between the optical element and the edge of the ion flow FL is adjusted such that the optical element such as the EUV collector mirror 12 is not in a range where the ionized debris is diffused, and the pressure of the etching gas inside the chamber 10 is optimized. With this, the ionized debris generated around the plasma generation site P1 can be collected using the magnetic field while a layer of the target material can be prevented from being formed on the surface of the optical element inside the chamber 10.

Figure 15:
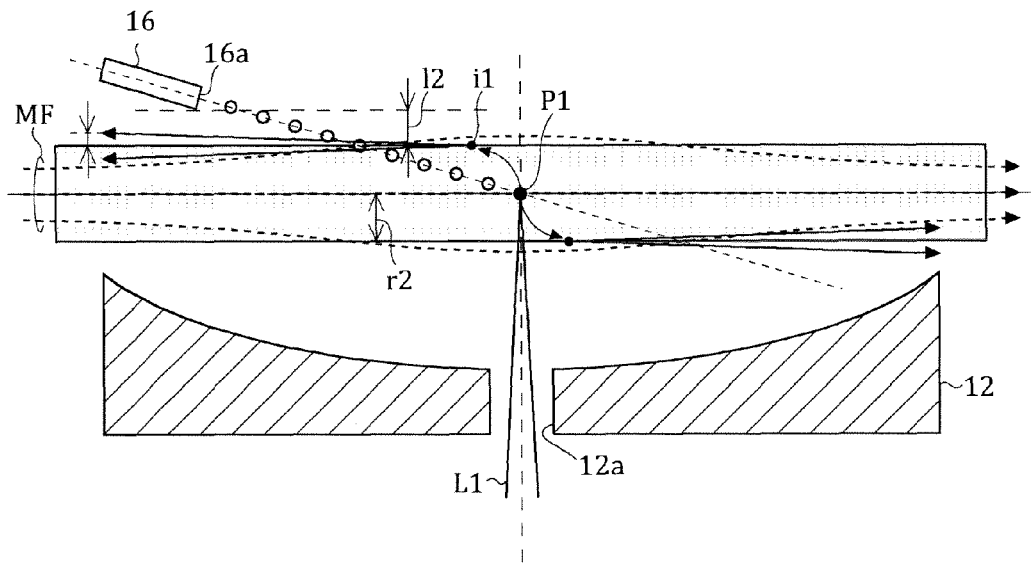
FIG. 15 illustrates an exemplary positional relationship among the plasma generation site, the EUV collector mirror, and a nozzle of a droplet generator in accordance with the first embodiment.

In the above description, a case where the diffused ionized debris is prevented from being incident on the EUV collector mirror 12 has been exemplified. However, the present disclosure is not limited thereto. FIG. 15 illustrates an exemplary positional relationship among the plasma generation site, the EUV collector mirror, and the nozzle of the droplet generator in accordance with the first embodiment. As shown in FIG. 15, for example, the tip of the nozzle 16$a$ of the droplet generator 16 is preferably positioned as close to the plasma generation site P1 as possible so that the droplet generator 16 can supply the droplet D with high precision and at favorable timing to the plasma generation site P1. However, if the ionized debris is deposited onto the tip of the nozzle 16$a$, the droplet D may not be outputted with high precision through the tip of the nozzle 16$a$. Thus, in the first embodiment, as shown in FIG. 15, a distance l2 between the edge of the ion flow FL and the tip of the nozzle 16$a$ is regulated such that the tip of the nozzle 16$a$ is not disposed in a range where the ionized debris is diffused, and the pressure of the etching gas inside the chamber 10 is optimized. Note that in this example, the direction into which the target is outputted is inclined with respect to the direction of the magnetic field. Without being limited to this example, however, the arrangement may be such that the direction into which the target is outputted is substantially perpendicular to the direction of the magnetic field, and the ionized debris does not reach the target material outlet port of the nozzle 16$a$.

Figure 16:
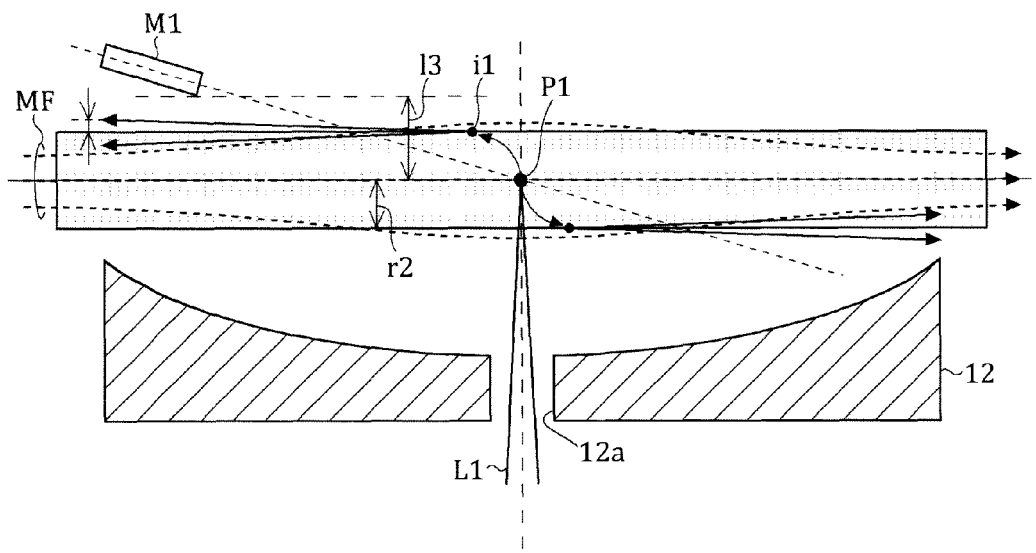
FIG. 16 illustrates an exemplary positional relationship among the plasma generation site, the EUV collector mirror, and a measuring unit in accordance with the first embodiment.

Further, FIG. 16 illustrates an exemplary positional relationship among the plasma generation site, the EUV collector mirror, and a measuring unit in accordance with the first embodiment. A measuring unit M1 for measuring light intensity or the like of the EUV light L2 emitted at the plasma generation site P1 is also preferably disposed as close to the plasma generation site P1 as possible in order to improve its measuring accuracy. Thus, in the first embodiment, a distance 13 between the edge of the ion flow FL and the tip of the measuring unit M1 is regulated, as shown in FIG. 16, such that the tip of the measuring unit M1 is not disposed in a range where the ionized debris is diffused, and the pressure of the etching gas inside the chamber 10 is optimized. Note that in this embodiment, a case of the measuring unit M1 for measuring the light intensity was exemplified, but without being limited to thereto, the embodiment can be applied to any sensor disposed inside the chamber. It may be applied, for example, to a detector for detecting the position of the target.

Figure 17:
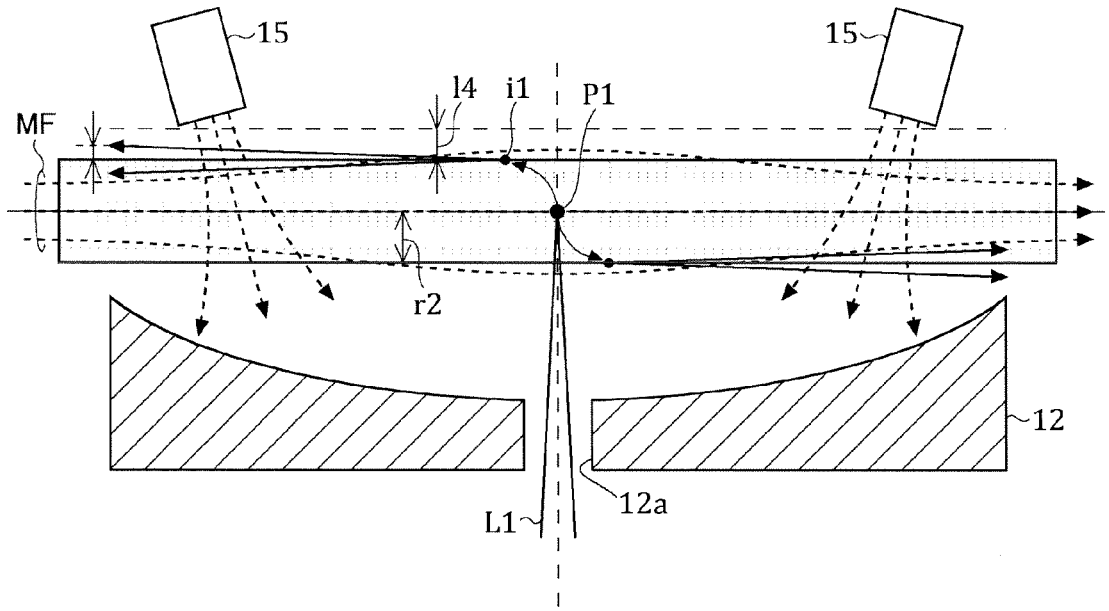
FIG. 17 illustrates an exemplary positional relationship among the plasma generation site, the EUV collector mirror, and an etching gas introduction unit in accordance with the first embodiment.

Furthermore, FIG. 17 illustrates an exemplary positional relationship among the plasma generation site, the EUV collector mirror, and an etching gas introduction unit in accordance with the first embodiment. The ionized debris generated around the plasma generation site P1 tends to be deposited onto the optical element disposed around the plasma generation site P1. Thus, the etching gas introduction unit 15 for introducing the etching gas into the chamber 10 is preferably disposed around the plasma generation site P1. Therefore, in the first embodiment, a distance 14 between the edge of the ion flow FL and the tip of the etching gas introduction unit 15 is regulated, as shown in FIG. 17, such that the tip of the etching gas introduction unit 15 is not disposed in a range where the ionized debris is diffused, and the pressure of the etching gas inside the chamber 10 is optimized. Note that the etching gas introduction unit 15 may be a radical introduction port for introducing the hydrogen radical or the like into the chamber 10.

Figure 18:
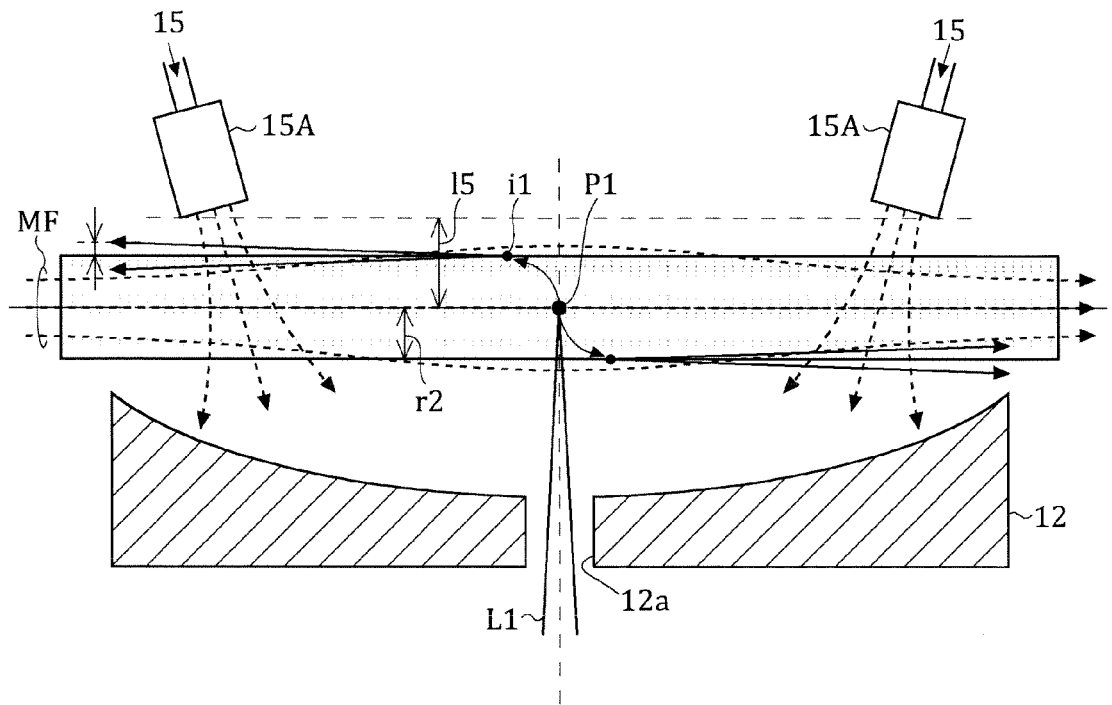
FIG. 18 illustrates an exemplary positional relationship among the plasma generation site, the EUV collector mirror, and a free radical source in accordance with the first embodiment.

FIG. 18 illustrates an exemplary positional relationship among the plasma generation site, the EUV collector mirror, and a free radical source in accordance with the first embodiment. As described above, the etching gas introduced into the chamber 10 is preferably a free radical that is highly reactive with the target material. Thus, in the first embodiment, as shown in FIG. 18, the free radical source 15A may be disposed at the tip of the etching gas introduction unit 15. With this, the etching gas supplied from the etching gas introduction unit 15 can be turned into a free radical by the free radical source 15A and the etching gas that has been turned into a free radical can be supplied into the chamber 10. However, as described with reference to FIG. 17, a part (free radical source 15A) for introducing the etching gas into the chamber 10 is preferably disposed around the plasma generation site P1. Thus, in the first embodiment, a distance 15 between the edge of the ion flow FL and the tip of the free radical source 15A is regulated, as shown in FIG. 18, such that the tip of the free radical source 15A is not disposed in a range where the ionized debris is diffused, and the pressure of the etching gas inside the chamber 10 is optimized.

Figure 19:
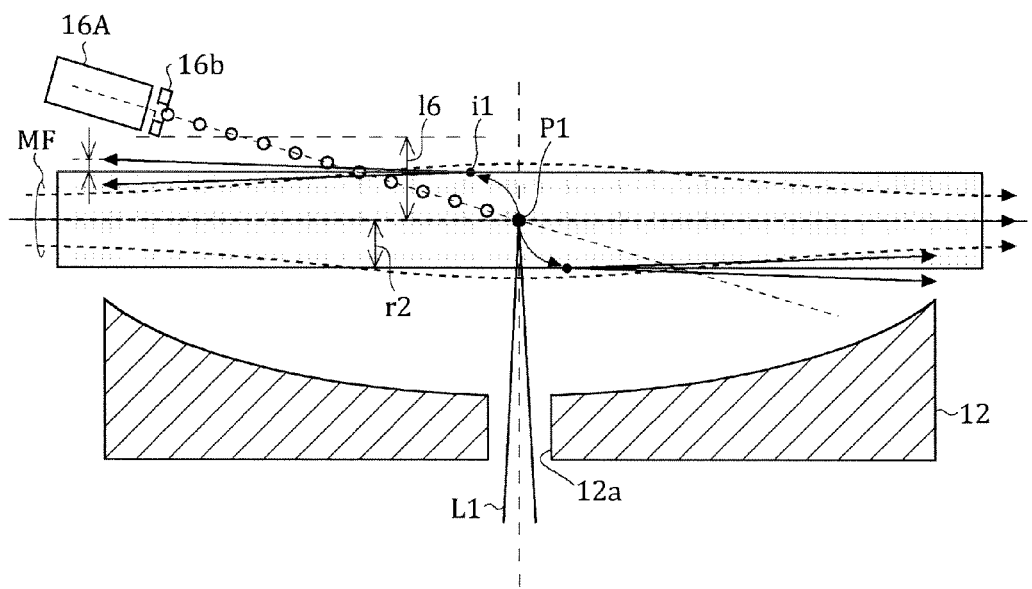
FIG. 19 illustrates an exemplary positional relationship among the plasma generation site, the EUV collector mirror, and an electrostatic suction type droplet generator in accordance with the first embodiment.
Figure 20:
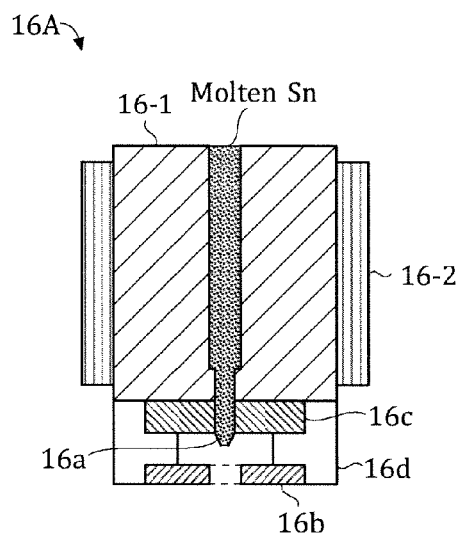
FIG. 20 is a sectional view illustrating a schematic configuration of the electrostatic suction type droplet generator shown in FIG. 19.

FIG. 19 illustrates an exemplary positional relationship among the plasma generation site, the EUV collector mirror, and an electrostatic suction type droplet generator in accordance with the first embodiment. The droplet generator 16 in accordance with the first embodiment may be replaced by an electrostatic suction type droplet generator 16A shown in FIG. 20. FIG. 20 illustrates a schematic configuration of the electrostatic suction type droplet generator shown in FIG. 19. As shown in FIG. 20, the electrostatic suction type droplet generator 16A includes a tank 16-1 for storing liquid state molten Sn thereinside, an electrode 16c for grounding the molten Sn inside the nozzle 16a projecting from the tank 16-1, and a suction electrode 16b disposed to face the electrode 16c with a space therebetween. The molten Sn inside the tank 16-1 may be heated to or above its melting point by a heater 16-2 provided around the tank 16-1, for example. Further, the suction electrode 16b is spaced from the electrode 16c by an insulator 16d and is fixed thereto. With this configuration, applying voltage of a several kV to the suction electrode 16b in pulses allows to pull out the droplet D through the tip of the nozzle 16a on demand.

Note that even in a case where the electrostatic suction type droplet generator 16A is used, similarly to the case where the droplet generator 16 is used, the tip of the nozzle 16a is preferably disposed as close to the plasma generation site P1 as possible. Thus, in the first embodiment, a distance 16 between the edge of the ion flow FL and the tip of the suction electrode 16b is regulated, as shown in FIG. 19, such that the suction electrode 16b positioned to face the nozzle 16a is not disposed in a range where the ionized debris is diffused, and the pressure of the etching gas inside the chamber 10 is optimized.

Figure 21:
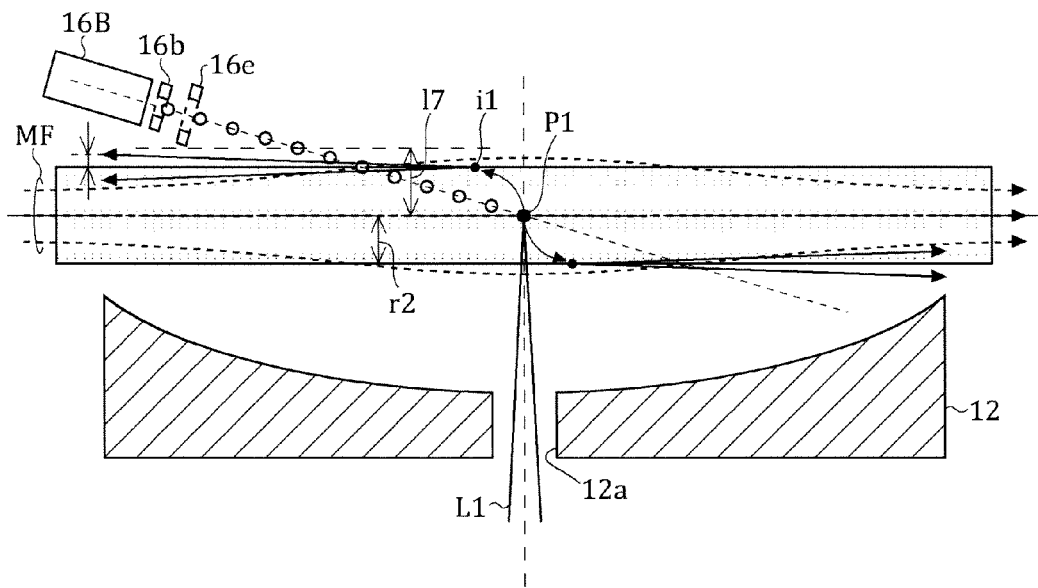
FIG. 21 illustrates an exemplary positional relationship among the plasma generation site, the EUV collector mirror, and an electrostatic suction and acceleration type droplet generator in accordance with the first embodiment.
Figure 22:
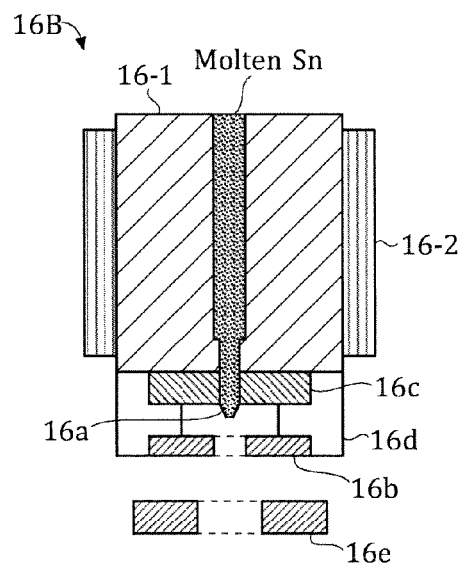
FIG. 22 is a sectional view illustrating a schematic configuration of the electrostatic suction and acceleration type droplet generator shown in FIG. 21.

Further, FIG. 21 illustrates an exemplary positional relationship among the plasma generation site, the EUV collector mirror, and an electrostatic suction and acceleration type droplet generator in accordance with the first embodiment. The droplet generator 16 in accordance with the first embodiment may be replaced by an electrostatic suction and acceleration type droplet generator 16B shown in FIG. 22. FIG. 22 illustrates a schematic configuration of the electrostatic suction and acceleration type droplet generator shown in FIG. 21. As shown in FIG. 22, the electrostatic suction and acceleration type droplet generator 16B includes, in addition to the configuration similar to that of the electrostatic suction type droplet generator 16A shown in FIG. 20, an acceleration electrode 16e disposed to face the suction electrode 16b. With this configuration, applying voltage of a several kV to the suction electrode 16b in pulses and applying voltage of a several ten kV or above to the acceleration electrode 16e enables to accelerate the droplet D pulled out through the tip of the nozzle 16a on demand.

In a case where the electrostatic suction type droplet generator 16A is used as described above, or in a case where the droplet is charged and is accelerated, high voltage of a several kV needs to be applied to an electrode facing a nozzle opening of the droplet generator. However, when the gas pressure inside the chamber 10 is high, insulation breakdown occurs in the gas; thus, high voltage cannot be applied. For this reason, when there is an element to which high voltage is applied, the maximum value of the gas pressure needs to be limited. For example, when the above-described electrostatic suction type droplet generator 16A or the acceleration electrode 16e is used, the chamber pressure is preferably kept approximately at or below 0.2 Pa.

Note that even in a case where the electrostatic suction and acceleration type droplet generator 163 is used, similarly to the case where the droplet generator 16 is used, the tip of the nozzle 16a is preferably disposed as close to the plasma generation site P1 as possible. Thus, in the first embodiment, a distance 17 between the edge of the ion flow FL and the acceleration electrode 16e is regulated, as shown in FIG. 21, such that the acceleration electrode 16e positioned to away from the nozzle 16a is not disposed in a range where the ionized debris is diffused, and the pressure of the etching gas inside the chamber 10 is optimized.

As described above, the optical element in accordance with the first embodiment includes, without being limited to the EUV collector mirror 12, various optical elements disposed inside the chamber 10. Further, elements such as the target generation nozzle through which the target is generated, various sensors, and the etching gas introduction unit or the like disposed inside the chamber are also included.

Second Embodiment

Figure 23:
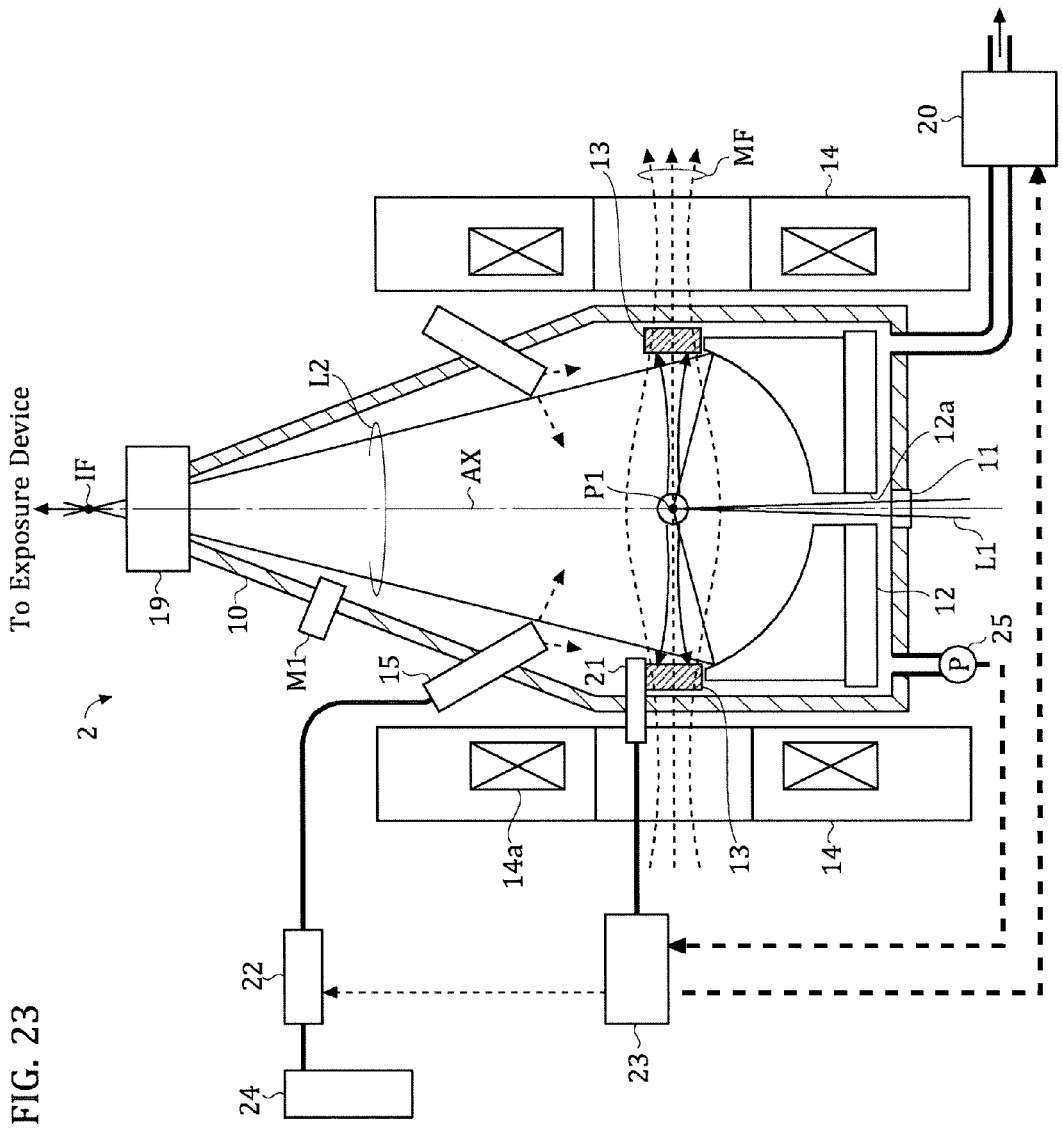
FIG. 23 is a sectional view illustrating a schematic configuration of an EUV light generation apparatus in accordance with a second embodiment of the present disclosure.

Next, an EUV light generation apparatus in accordance with a second embodiment of the present disclosure will be described in detail with reference to the drawing. FIG. 23 is a sectional view illustrating a schematic configuration of the EUV light generation apparatus in accordance with the second embodiment. As shown in FIG. 23, an EUV light generation apparatus 2 in accordance with the second embodiment includes, in addition to the configuration similar to that of the EUV light generation apparatus 1 in accordance with the first embodiment, an ion sensor 21 disposed close to the ion collection unit 13, a mass flow controller (MFC) 22 for controlling the flow rate of the etching gas introduced into the chamber 10 from the etching gas introduction unit 15, the MFC 22 being disposed between the gas tank 24 for storing the etching gas and the etching gas introduction unit 15, a controller 23 for controlling the MFC 22 based on the amount of ions detected at the ion sensor 21, an exhaust pump 20 for discharging the gas inside the chamber 10, and a pressure sensor 25 for detecting the chamber pressure. Note that the gas tank 24 was omitted in the above-described first embodiment, but it is also provided to the EUV light generation apparatus 1. Further, the MFC and the controller 23 regulates the flow rate of the etching gas such that the gas pressure inside the chamber 10 is at the gas pressure at which the diffusion width of the ionized debris is shorter than the distance between the edge of the ion flow FL in which the ionized debris travels while being trapped in the magnetic field and the optical element, and controls the exhaust pump 20 to control the discharge rate of the gas to be discharged.

The ion sensor 21 detects the amount of the ionized debris that did not enter the ion collection unit 13 because it was diffused by the gas (mainly etching gas) inside the chamber 10. Thus, the ion sensor 21 is disposed next to the ion collection unit 13 and as close to the ion collection unit 13 as possible. The controller 23 controls the MFC 22 when an ion is detected at the ion sensor 21 or when the amount of ions detected at the ion sensor 21 exceeds a predetermined threshold value, whereby the flow rate of the etching gas flowing into the etching gas introduction unit 15 from the gas tank 24 is temporarily reduced. With this, the amount of the etching gas introduced into the chamber 10 can be adjusted to lower the chamber pressure. As a result, the diffusion width of the ionized debris trapped in the magnetic field is reduced, and the amount of ionized debris that does not flow into the ion collection unit 13 is reduced. Alternatively, the flow rate at the mass flow controller (MFC) 22 for controlling the flow rate of the etching gas is kept constant, and the discharge rate at the exhaust pump 20 may be controlled.

This way, by optimizing the gas pressure inside the chamber 10 based on the actual amount of the ionized debris that does not flow into the ion collection unit 13, the ionized debris generated around the plasma generation site P1 can be collected into the ion collection unit 13 more reliably. With this, the ionized debris generated around the plasma generation site P1 can be collected using the magnetic field, and a layer of the target material can be prevented from being formed on the surface of the optical element inside the chamber 10 more reliably.

Note that in the above description, the ion sensor 21 is disposed close to the ion collection unit 13, and the amount of the ionized debris that does not flow into the ion collection unit 13 is detected. However, without being limited thereto, the ion sensor 21 connected to the controller 23 may be disposed close to various optical elements, such as the EUV collector mirror 12, the nozzle 16a of the droplet generator 16, the measuring unit M1, the etching gas introduction unit 15, or the free radical source 15A, whereby the amount of the ionized debris incident on these optical elements may be detected. Based on the detected result, the chamber pressure may be controlled using at least either one of the MFC 22 and the exhaust pump 20.

Third Embodiment

Figure 24:
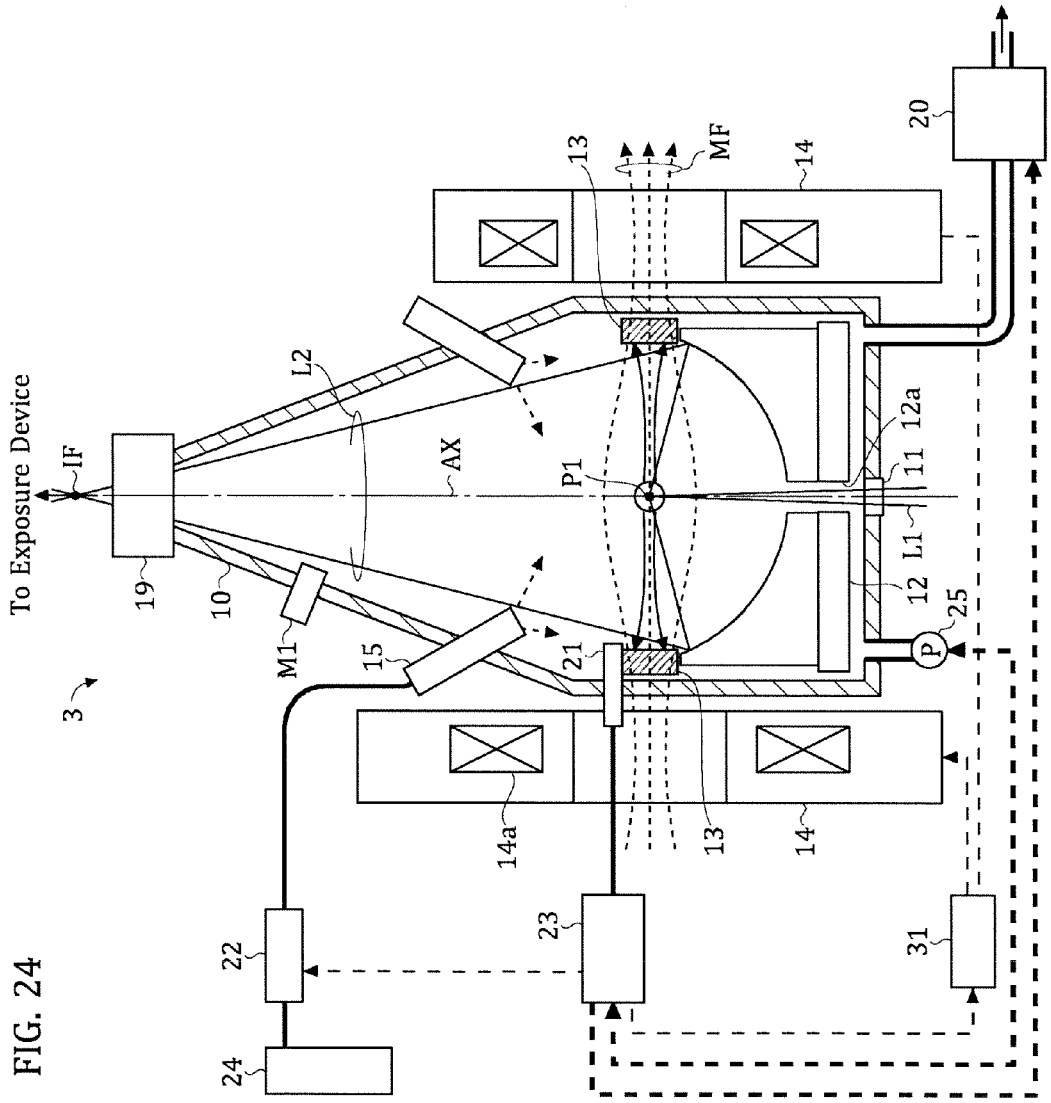
FIG. 24 is a sectional view illustrating a schematic configuration of an EUV light generation apparatus in accordance with a third embodiment of the present disclosure.

Next, an EUV light generation apparatus in accordance with a third embodiment will be described in detail with reference to the drawing. FIG. 24 is a sectional view illustrating a schematic configuration of the EUV light generation apparatus in accordance with the third embodiment. As shown in FIG. 24, an EUV light generation apparatus 3 in accordance with the third embodiment includes, in addition to the configuration similar to that of the EUV light generation apparatus 2 in accordance with the above-described second embodiment, a magnet controller 31 connected to each of the pair of magnets 14. The magnet controller 31 and the controller 23 function as a magnetic field intensity control unit for controlling the intensity of the magnetic field such that the magnetic flux density of the magnetic field generated around the plasma generation site P1 is the magnetic flux density at which the diffusion width of the ionized debris is shorter than the distance between the edge of the ion flow FL flowing while being trapped in the magnetic field and the optical element. In this case, a correlation between current applied to the coil 14a and the magnetic flux density of the magnetic field generated around the plasma generation site P1 may be calculated in advance, and current applied to the coil 14a may be controlled so that the magnetic field of a desired magnetic flux density can be generated. Note that a magnetic sensor (not shown) may be provided around the magnet 14 to measure the magnetic flux density. When the magnetic sensor is provided, the magnet controller 31 may control the intensity of the magnetic field based on the magnetic flux density value detected by the magnetic sensor. In this case, a correlation between a magnetic flux density at a position where the magnetic flux density is measured by the magnet sensor and a magnetic flux density of the magnetic field generated around the plasma generation site P1 may be calculated in advance, and current applied to the coil 14a may be controlled so that the magnetic field of a desired magnetic flux density can be generated.

Under the control of the controller 23, the magnet controller 31 controls the intensity of the magnetic field generated by the pair of magnets 14. That is, the controller 23 controls the MFC 22 to temporarily reduce the flow rate of the etching gas flowing into the etching gas introduction unit 15 from the gas tank 24 and controls the magnet controller 31 when an ion is detected at the ion sensor 21 or when the amount of ions detected at the ion sensor 21 exceeds a predetermined threshold value, whereby the intensity of the magnetic field generated around the plasma generation site P1 is increased. With this, the amount of the etching gas introduced into the chamber 10 is adjusted to lower the chamber pressure and to increase the magnetic flux density, whereby the diffusion width of the ionized debris can be reduced. As a result, the diffusion width of the ionized debris trapped in the magnetic field is reduced, and the amount of the ionized debris that does not flow into the ion collection unit 13 is reduced.

This way, by optimizing the gas pressure inside the chamber 10 and the magnetic flux density based on the actual amount of the ionized debris that does not flow into the ion collection unit 13, the ionized debris generated around the plasma generation site P1 can be collected into the ion collection unit 13 more reliably. With this, the ionized debris generated around the plasma generation site P1 can be collected using the magnetic field, and a layer of the target material can be prevented from being formed on the surface of the optical element inside the chamber 10 more reliably.

Note that in the above description, the ion sensor 21 is disposed close to the ion collection unit 13 to detect the amount of the ionized debris that does not flow into the ion collection unit 13. However, without being limited thereto, the ion sensor 21 connected to the controller 23 may be disposed close to various optical elements, such as the EUV collector mirror 12, the nozzle 16a of the droplet generator 16, the measuring unit M1, the etching gas introduction unit 15, or the free radical source 15A, whereby the amount of the ionized debris incident on these optical elements may be detected.

Fourth Embodiment

Figure 25:
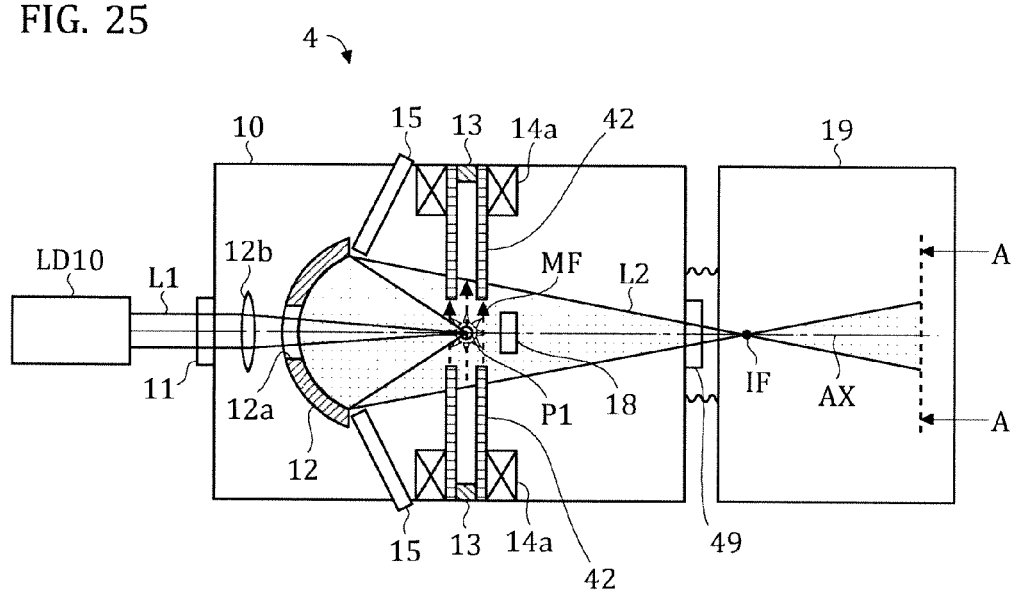
FIG. 25 is a sectional view illustrating a schematic configuration of an EUV light generation apparatus in accordance with a fourth embodiment of the present disclosure.
Figure 26:
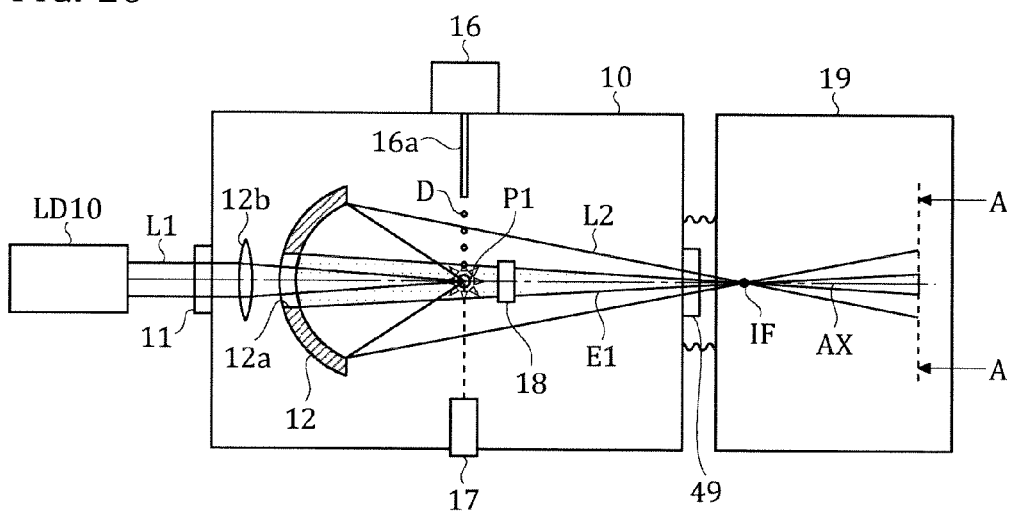
FIG. 26 is a sectional view illustrating a schematic configuration of the EUV light generation apparatus in accordance with the fourth embodiment, taken along a different plane from that shown in FIG. 17.

Next, an EUV light generation apparatus in accordance with a fourth embodiment will be described in detail with reference to the drawings. FIGS. 25 and 26 are sectional views each illustrating a schematic configuration of the EUV light generation apparatus in accordance with the fourth embodiment. FIG. 26 is a sectional view taken along a plane containing the axis AX and along a different plane from that shown in FIG. 25.

As shown in FIGS. 25 and 26, an EUV light generation apparatus 4 in accordance with the fourth embodiment includes a configuration similar to that of any one of the EUV light generation apparatuses of the above first through third embodiments, but the coils 14a for generating the magnetic field around the plasma generation site P1 are disposed inside the chamber 10. Note that the chamber 10 is connected to the exposure device connection unit 19 via a gate valve 49 for maintaining the airtightness of the chamber 10. Further, the EUV light generation apparatus 4 includes a magnetic core 42 extending cylindrically toward the plasma generation site P1 from a bore of each coil 14a. This makes it possible to generate a strong magnetic field around the plasma generation site P1. As a result, a strong magnetic field around the plasma generation site P1 can be generated while effects of the magnetic field on the measuring devices or the like therearound are minimized.

Further, the central line of magnetic force of the magnetic field generated by the magnetic cores 42 of which tips face each other with the plasma generation site P1 therebetween passes through the plasma generation site P1, and the direction thereof coincides with axes of the cylindrical magnetic cores 42. Accordingly, the ion collection unit 13 is disposed at the center of the bore of each coil 14a and inside each magnetic core 42. Further, a diameter of an opening of each magnetic core 42 toward the plasma generation site P1 is at least larger than the value in which a diffusion width of the ion debris is added to the diameter of the ion flow FL, similarly to the positional relationship between the edge of the ion flow FL and the edge of the EUV collector mirror 12. With this, the ionized debris generated around the plasma generation site P1 can reliably be introduced into the interior of the magnetic core 42. As a result, the ionized debris generated around the plasma generation site P1 can be trapped in the magnetic field generated intensively around the plasma generation site P1 and thereafter be collected into the ion collection unit 13 disposed at the bottom of the magnetic core 42.

With the above configuration, the ionized debris can be trapped using a stronger magnetic field; thus, even when the etching gas pressure inside the chamber 10 is increased, the diffusion width of the ionized debris can be minimized. As a result, in a configuration where the ionized debris generated around the plasma generation site P1 is collected using the magnetic field, a layer of the target material can more reliably be prevented from being formed on the surface of the optical element inside the chamber 10. In this embodiment, the magnetic cores 42 can be disposed close to the plasma generation site P1; thus, even when the etching gas pressure is increased, the ionized debris can be trapped. For example, in a case where an etching gas including hydrogen gas or a hydrogen radical is used, even when the chamber pressure is increased up to 100 Pa, the ionized debris can be trapped and collected, and Sn deposited on the EUV collector mirror 12 can etched.

Figure 27:
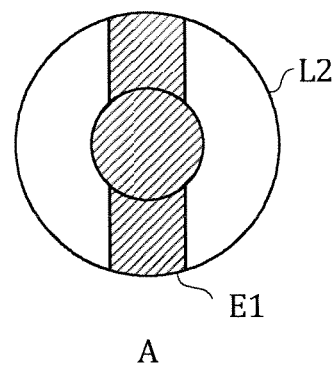
FIG. 27 is a view showing a far field pattern formed by the EUV light on A-A plane shown in FIG. 26.

Further, the magnetic cores 42 disposed inside the chamber 10 extend into an obscuration region E1 from the coils 14a disposed outside the obscuration region E1. Here, FIG. 27 illustrates a far field pattern formed on A-A plane by the EUV light shown in FIG. 26. As shown in FIG. 27, the EUV light L2 includes the obscuration region E1 along a plane perpendicular to the axis AX. The obscuration region E1 refers to a region corresponding to an angular range where the EUV light L2 collected by the EUV collector mirror 12 is not used in the exposure device 100. In the following description, a three-dimensional volumetric region contained in the angular range of the EUV light L2 which is not used in the exposure device 100 is referred to as the obscuration region E1.

Figure 28:
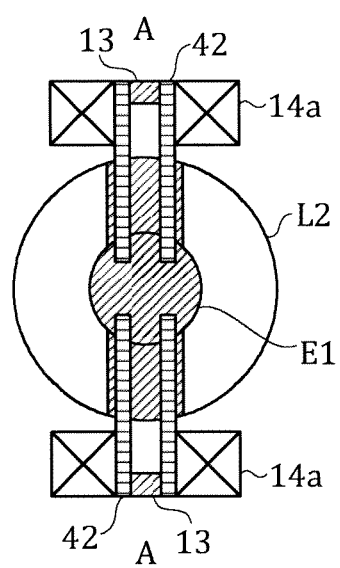
FIG. 28 illustrates an exemplary positional relationship between a magnetic core and an obscuration region in accordance with the fourth embodiment.

As described above, the EUV light L2 in the obscuration region E1 is not used for exposure in the exposure device 100. Thus, even when the EUV light L2 in the obscuration region E1 is not inputted into the exposure device 100, exposure performance or throughput of the exposure device 100 is not affected at all. Therefore, in the fourth embodiment, as shown in FIG. 28, the magnetic cores 42 are made to extend into the obscuration region E1. With this, the tips of the magnetic cores 42 can be disposed even closer to the plasma generation site P1. As a result, a stronger magnetic field can be generated in a smaller region around the plasma generation site P1. Note that FIG. 28 illustrates an exemplary positional relationship between the magnetic cores and the obscuration region in accordance with the fourth embodiment.

Figure 29:
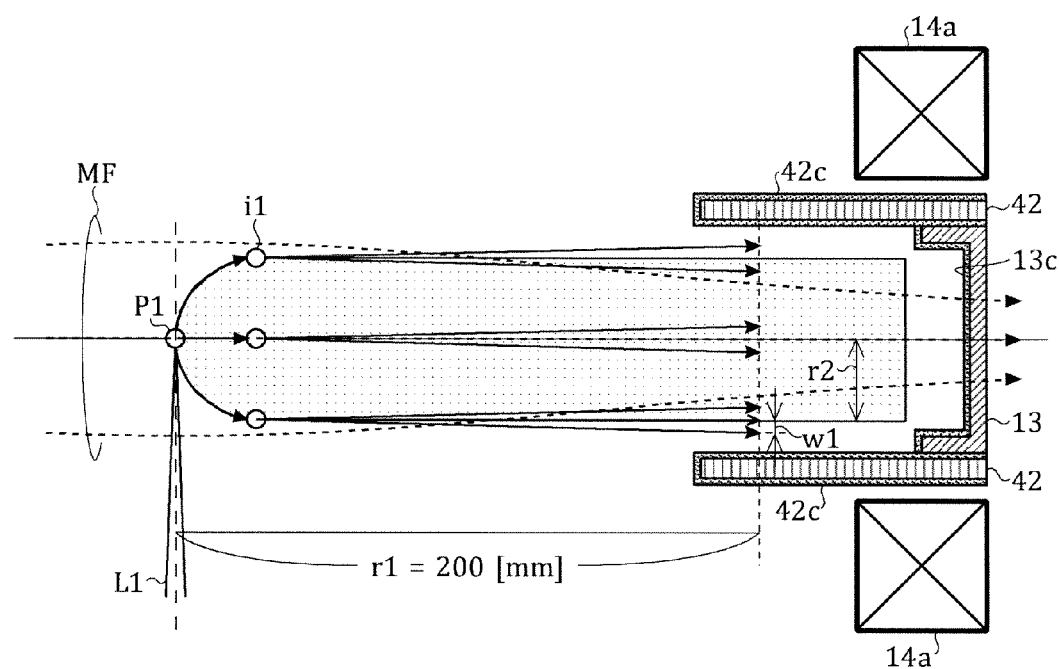
FIG. 29 illustrates an exemplary positional relationship among an ion flow, the magnetic core, coils, and the ion collection unit in accordance with the fourth embodiment.

Further, as shown in FIG. 29, the magnetic core 42 that extends into the obscuration region E1, for example, is preferably coated with a coating film 42c made of a material that is less likely to be sputtered by the ionized debris, the material including tungsten (W), tin (Sn), ruthenium (Ru), molybdenum (Mo), silicon (Si), carbon (C) or the like. Further, it may be coated with Cu or Ti that is highly wettable with Sn. With this, the magnetic core 42 is prevented from being sputtered, whereby debris of the material of the magnetic core 42 is prevented from being generated inside the chamber 10. Note that FIG. 29 illustrates an exemplary positional relationship among the ion flow, the magnetic core, the coil, and the ion collection unit in accordance with the fourth embodiment.

Further, as shown in FIG. 29, the ion collection unit 13 is also preferably coated with a coating film 13c made of a material similar to that for the coating film 42c. With this, the ion collection unit 13 can be prevented from being sputtered.

Other configurations are the similar to those of any one of the above-described first through third embodiments; thus, the duplicate description thereof is omitted here. Note that a driver laser LD10 shown in FIGS. 25 and 26 is a configuration of which description is omitted in each of the above embodiments. However, it can be provided in each embodiment, and it serves as a light source of the laser beam L1.

Fifth Embodiment

Figure 30:
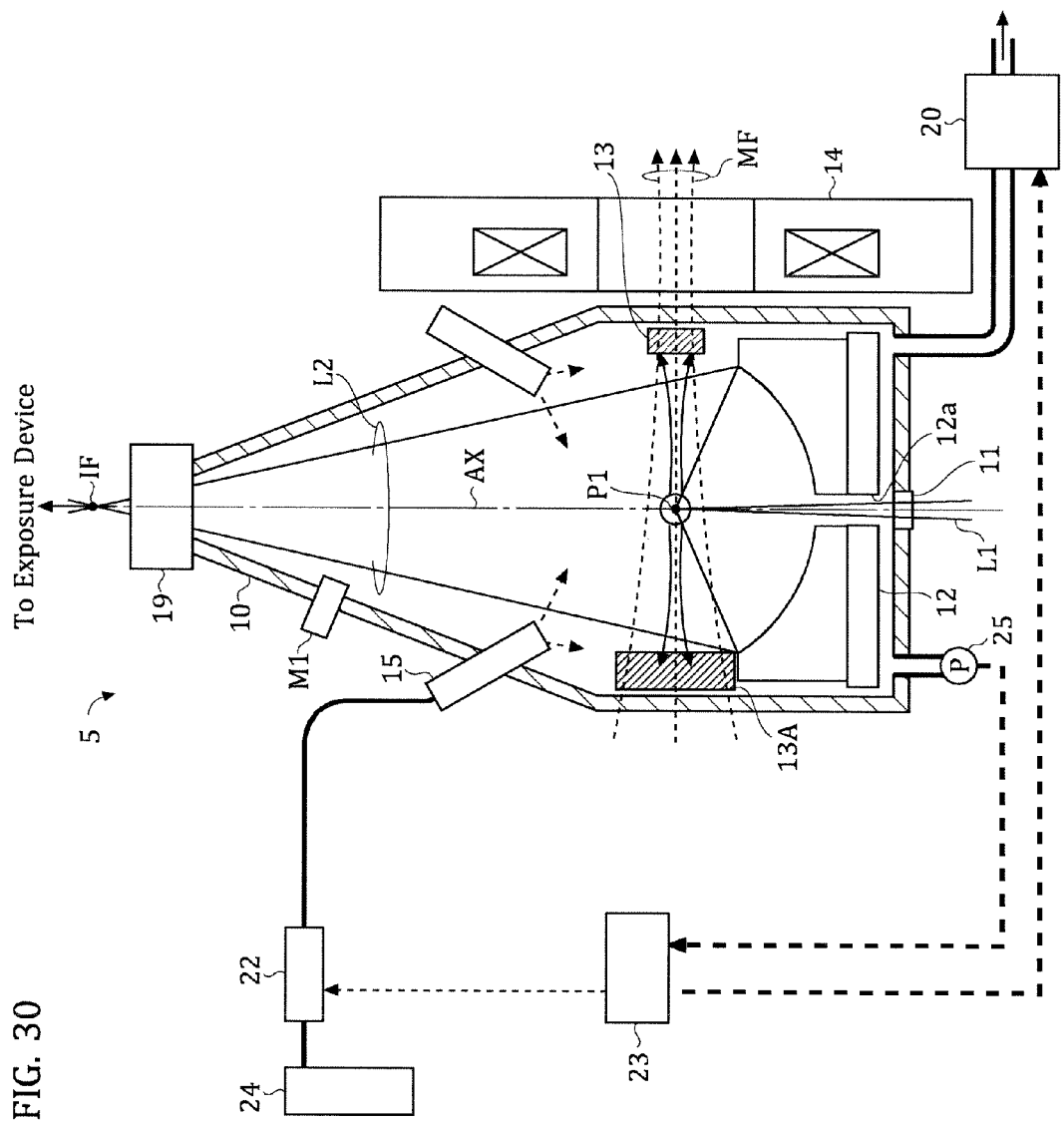
FIG. 30 is a sectional view illustrating a schematic configuration of an EUV light generation apparatus in accordance with a fifth embodiment, in which only one coil is provided.

An EUV light generation apparatus in accordance with a fifth embodiment of the present disclosure will be described in detail with reference to the drawing. FIG. 30 is a sectional view illustrating a schematic configuration of the EUV light generation apparatus in accordance with the fifth embodiment. As shown in FIG. 30, an EUV light source device 5 in accordance with the fifth embodiment includes a similar configuration as that of the EUV light generation apparatus 2 in accordance with the above-described second embodiment, but includes only one magnet 14. That is, in the fifth embodiment, a case where the magnetic field is generated around the plasma generation site P1 by a single coil configured of the one magnet 14 will be exemplified.

When plasma is generated around the plasma generation site P1, ions are trapped in the magnetic field and travel in the direction of the magnetic field. The magnetic flux density at the side of the magnet 14 is higher with respect to the plasma generation site P1. On the other hand, the magnetic flux density at the side where the magnet 14 is not disposed is lower with respect to the plasma generation site P1. Thus, in accordance with the state of the magnetic flux density, the ion collection unit at the side where the magnet 14 is not disposed is replaced by an ion collection unit 13A having a larger opening than the ion collection unit 13 at the side where the magnet 14. In the fifth embodiment configured as such, the ion collection unit 13 and the ion collection unit 13A are disposed with their opening size being adjusted.

In the fifth embodiment, however, is not limited to the case where the ion collection unit 13 and the ion collection unit 13A have differing opening diameters, but the ion collection unit 13 may be disposed in place of the ion collection unit 13A. In such configuration, the controller 23 detects the pressure inside the chamber 10 by a signal from the pressure sensor 25 to thereby control the flow rate of the etching gas with the MFC 22, or controls the discharge rate of the exhaust pump 20 to thereby control the etching gas pressure to desired pressure.

The above-described embodiments and the modifications thereof are merely examples for implementing the present disclosure, and the present disclosure is not limited thereto. Further, making various modifications in accordance with the specification is within the scope of the present disclosure, and it is apparent that the various other embodiments can be made from the above description without departing from the scope of the present disclosure. For example, it is needless to state that the modifications indicated for each of the embodiments can be applied to the other embodiments.

What is claimed is:

1. An extreme ultraviolet light generation apparatus used in combination with a laser system, the apparatus comprising:
   a chamber provided with at least one inlet port and configured for introducing a laser beam outputted from the laser system into the chamber;
   a target supply unit provided to the chamber and configured for supplying a target material to a predetermined region inside the chamber, where the target material is irradiated with the laser beam;
   a gas introduction unit configured for introducing an etching gas including hydrogen gas into the chamber;
   a pressure detector configured for detecting pressure inside the chamber;
   a mass flow controller configured for controlling a flow rate of the etching gas;
   an exhaust unit configured for discharging gas inside the chamber, and
   a controller configured for controlling at least one of the mass flow controller and the exhaust unit based on a value detected by the pressure detector.

2. The apparatus of claim 1, wherein the pressure inside the chamber is approximately at or above 0.5 Pa and is approximately at or below 13 Pa.

3. The new apparatus according to claim 2, further comprising:
   a magnetic field generation unit configured for generating a magnetic field around the predetermined region; and
   an ion collection unit disposed in a direction of a line of magnetic force of the magnetic field and configured for collecting an ion which is generated when the target material is irradiated with the laser beam and flows along the line of magnetic force.

4. The apparatus of claim 3, further comprising:
   a magnetic field intensity controller configured for controlling intensity of the magnetic field;
   a power source configured for supplying current to the magnetic field generation unit; and
   an ion sensor disposed close to the at least one optical element and configured for detecting an ion.

5. The apparatus of claim 3, wherein the magnetic flux density of the magnetic field is approximately at or above 0.35 tesla and is approximately at or below 2 tesla.

6. The apparatus of claim 3, further comprising
   is a collector mirror configured for collecting extreme ultraviolet light emitted as the target material is irradiated with the laser beam inside the chamber.

7. The apparatus of claim 6, wherein:
   the magnetic field generation unit includes a coil to which current is supplied and a magnetic core which extends toward the predetermined region from the coil, and
   a part of the magnetic core extends into an obscuration region of the extreme ultraviolet light collected by the collector mirror.

8. The apparatus of claim 7, wherein
   a coating film is formed on a surface of the magnetic core.

9. The apparatus of claim 7, wherein:
   the magnetic core is cylindrical with one end thereof being open, and
   the ion collection unit is disposed at the other end of the magnetic core.

10. The apparatus of claim 9, wherein a coating film is formed on a surface of the ion collection unit.

11. An extreme ultraviolet light generation apparatus used in combination with a laser system, the apparatus comprising:
    a chamber provided with at least one inlet port and configured for introducing a laser beam outputted from the laser system into the chamber;
    a target supply unit provided to the chamber and configured for supplying a target material to a predetermined region inside the chamber, where the target material is irradiated with the laser beam;
    a gas introduction unit configured for introducing an etching gas mending hydrogen gas into the chamber;
    a pressure detector configured for detecting pressure inside the chamber;
    a mass flow controller configured for controlling a flow rate of the etching gas;
    an exhaust unit configured for discharging gas inside the chamber;
    a controller configured for controlling at least one of the mass flow controller and the exhaust unit based on a value detected by the pressure detector;
    a magnetic field generation unit configured for generating a magnetic field around the predetermined region; and
    an ion collection unit disposed in a direction of a line of magnetic force of the magnetic field and configured for collecting an ion which is generated when the target material is irradiated with the laser beam and flows along the line of magnetic force.

12. The apparatus of claim 11, further comprising a free radical source configured for turning the etching gas into a free radical.

13. The apparatus of claim 12, wherein the pressure inside the chamber is approximately at or above 0.5 Pa and is approximately at or below 13 pa.

* * * * *